United States Patent
Uehara

(10) Patent No.: US 11,018,645 B2
(45) Date of Patent: May 25, 2021

(54) OSCILLATOR, ELECTRONIC APPARATUS AND VEHICLE

(71) Applicant: SEIKO EPSON CORPORATION, Tokyo (JP)

(72) Inventor: Jun Uehara, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/794,906

(22) Filed: Feb. 19, 2020

(65) Prior Publication Data

US 2020/0274512 A1    Aug. 27, 2020

(30) Foreign Application Priority Data

Feb. 21, 2019 (JP) .............................. JP2019-029113

(51) Int. Cl.

| | |
|---|---|
| *G01N 27/00* | (2006.01) |
| *G08B 19/00* | (2006.01) |
| *G08B 21/00* | (2006.01) |
| *G01J 5/00* | (2006.01) |
| *G01K 7/00* | (2006.01) |
| *G05D 23/20* | (2006.01) |
| *G08B 13/18* | (2006.01) |
| *G08B 27/00* | (2006.01) |
| *H03H 3/04* | (2006.01) |
| *H03B 5/04* | (2006.01) |
| *H03H 9/64* | (2006.01) |
| *G05D 23/19* | (2006.01) |
| *H03B 5/12* | (2006.01) |

(52) U.S. Cl.
CPC ........... *H03H 3/04* (2013.01); *G05D 23/1917* (2013.01); *H03B 5/04* (2013.01); *H03B 5/12* (2013.01); *H03H 9/64* (2013.01)

(58) Field of Classification Search
CPC ... H03H 3/04; H03H 9/64; H03B 5/12; H03B 5/04; G05D 23/1917
USPC .......................................................... 331/66
See application file for complete search history.

(56) References Cited

U.S. PATENT DOCUMENTS

| | | | | |
|---|---|---|---|---|
| 7,907,027 | B2 * | 3/2011 | Partridge | ................ H03L 1/026 |
| | | | | 331/154 |
| 2010/0289589 | A1 | 11/2010 | Ito et al. | |
| 2017/0353171 | A1 * | 12/2017 | Ito | ............................ H03H 9/08 |

FOREIGN PATENT DOCUMENTS

| | | |
|---|---|---|
| JP | 2011-004382 A | 1/2011 |
| JP | 2016-051992 A | 4/2016 |
| JP | 2017-220770 A | 12/2017 |

* cited by examiner

*Primary Examiner* — Richard Tan

(74) *Attorney, Agent, or Firm* — Rankin, Hill & Clark LLP

(57) ABSTRACT

Provided is an oscillator including: a resonator; a first circuit device electrically coupled to the resonator; and a second circuit device. The first circuit device generates a first clock signal by causing the resonator to oscillate, and performs first temperature compensation processing for temperature compensating a frequency of the first clock signal. The second circuit device receives the first clock signal from the first circuit device, generates a second clock signal based on the first clock signal, and performs second temperature compensation processing for temperature compensating a frequency of the second clock signal.

14 Claims, 15 Drawing Sheets

OSCILLATOR, ELECTRONIC APPARATUS AND VEHICLE

The present application is based on, and claims priority from JP Application Serial Number 2019-029113, filed Feb. 21, 2019, the disclosure of which is hereby incorporated by reference herein in its entirety.

BACKGROUND

1. Technical Field

The present disclosure relates to an oscillator, an electronic apparatus, a vehicle and the like.

2. Related Art

In the related art, a temperature compensation type oscillator that performs temperature compensation based on a temperature detection result is known. As such a temperature compensation type oscillator, for example, the related art disclosed in JP-A-2017-220770 is known. In this oscillator of the related art, a clock signal is generated using a fractional N type PLL circuit that multiplies a frequency of an oscillation signal of the resonator. The oscillator includes a temperature measurement unit and a storage unit for storing a temperature correction table, and sets a division ratio of the fractional N type PLL circuit based on the temperature measurement value from the temperature measurement unit and the temperature correction table. In this way, digital-mode temperature compensation processing is realized. Specifically, the temperature correction table stores the temperature measurement value that is digital temperature detection data, and the division ratio in association with each other. Further, the division ratio of the fractional N type PLL circuit is set based on the data of the division ratio read from the temperature correction table based on the temperature measurement value. As a result, a clock signal obtained by multiplying the frequency of the oscillation signal of the resonator is output from the oscillator.

In the digital-mode temperature compensation processing as described in JP-A-2017-220770, a micro-jump of frequency occurs due to a variation in the temperature measurement result. In this case, when the gain of temperature compensation increases, a problem such as an increase in the micro-jump occur. When such a problem occurs, it becomes difficult to realize the clock frequency of the oscillator with high accuracy.

SUMMARY

An aspect of the present disclosure relates to an oscillator including: a resonator; a first circuit device electrically coupled to the resonator; and a second circuit device, in which the first circuit device generates a first clock signal by causing the resonator to oscillate, and performs first temperature compensation processing for temperature compensating a frequency of the first clock signal, and the second circuit device receives the first clock signal from the first circuit device, generates a second clock signal based on the first clock signal, and performs second temperature compensation processing for temperature compensating a frequency of the second clock signal.

DESCRIPTION OF EXEMPLARY EMBODIMENTS

Hereinafter, the present embodiment will be described. Note that the present embodiment to be described below does not unduly limit the contents of the disclosure described in the appended claims. In addition, all configurations to be described in the present embodiment are not limited to being essential constituent conditions.

1. Oscillator

Figure 1:
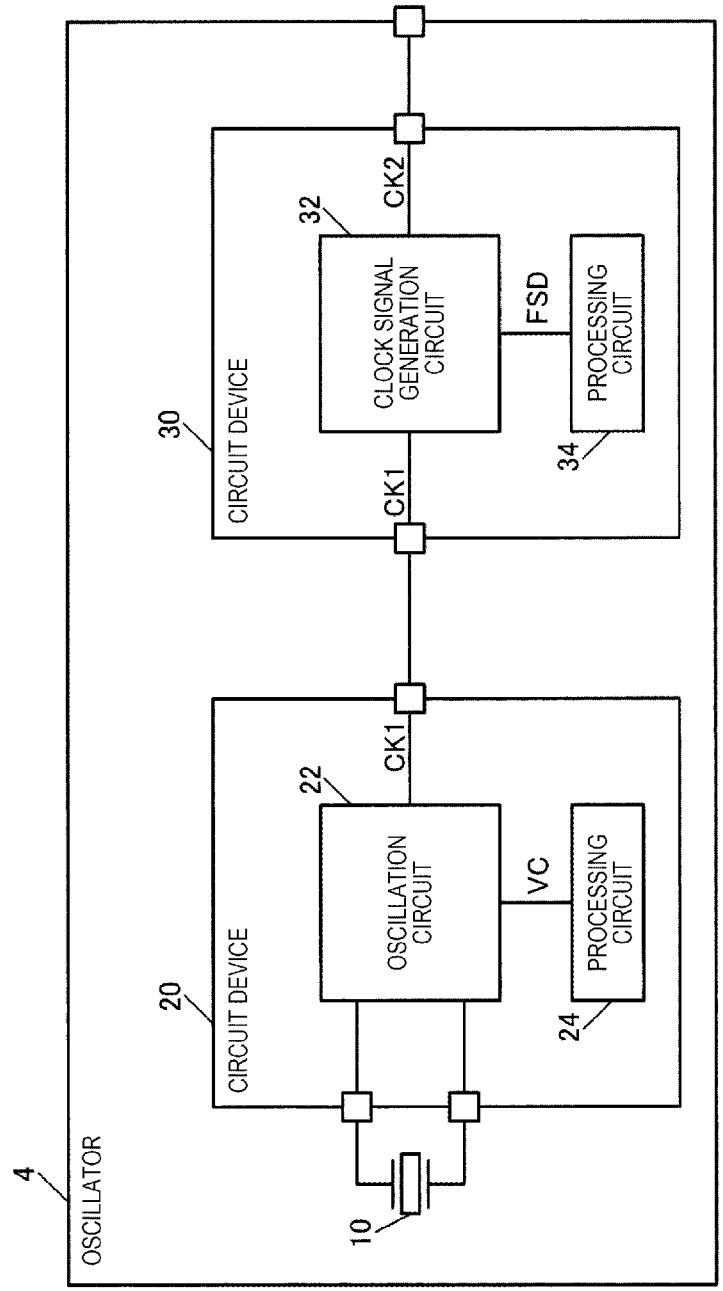
FIG. 1 shows a basic configuration example of an oscillator according to a present embodiment.

FIG. 1 shows a basic configuration example of an oscillator 4 according to a present embodiment. The oscillator 4 is a temperature compensated oscillator and includes a resonator 10, a circuit device 20, and the circuit device 30. The oscillator 4 may be a temperature compensated crystal oscillator (TCXO) that does not include a constant temperature oven, or may be a constant temperature oven controlled crystal oscillator (OCXO) that includes a constant temperature oven. The circuit device 20 is a first circuit device, and the circuit device 30 is a second circuit device. The circuit device 20 is electrically coupled to the resonator 10. For example, the resonator 10 and the circuit device 20 are electrically coupled to each other via a bonding wire, a metal bump, an internal wiring of a package, or the like. In FIG. 1, the circuit device 30 is electrically coupled to the circuit device 20. For example, the circuit device 20 and the circuit device 30 are electrically coupled to each other via a bonding wire, a metal bump, an internal wiring of a package, or the like.

The resonator 10 is an element generating mechanical vibration by an electric signal. The resonator 10 can be realized by a resonator element such as a quartz crystal resonator element, for example. For example, the resonator 10 can be realized by a quartz crystal resonator element in which a cut angle vibrates in a thickness-slide manner such as an AT cut or a SC cut. Note that the resonator 10 according to the present embodiment can be realized by various resonator elements such as resonator elements other than a thickness-slide vibration type or piezoelectric resonator elements formed of materials other than quartz crystal. For example, as the resonator 10, a surface acoustic wave (SAW) resonator, a micro electromechanical systems (MEMS) resonator as a silicon resonator formed using a silicon substrate, or the like may be adopted.

The circuit devices 20 and 30 are integrated circuit devices called an integrated circuit (IC). For example, the circuit devices 20 and 30 are ICs manufactured by a semiconductor process, and are semiconductor chips in which circuit elements are formed on a semiconductor substrate.

The circuit device 20 that is the first circuit device generates a clock signal CK1 by causing the resonator 10 to oscillate, and performs a first temperature compensation processing for temperature compensating the frequency of the clock signal CK1. The circuit device 20 outputs the clock signal CK1 on which the first temperature compensation processing is performed. The clock signal CK1 is a first clock signal. The first temperature compensation processing is processing for suppressing and compensating the frequency fluctuation of the clock signal CK1 due to a temperature fluctuation.

The circuit device 30 that is the second circuit device receives the clock signal CK1 from the circuit device 20, generates a clock signal CK2 based on the clock signal CK1, and performs a second temperature compensation processing for temperature compensating the frequency of the clock signal CK2. The circuit device 30 outputs the clock signal CK2 on which the second temperature compensation processing is performed. The clock signal CK2 is a second clock signal. The second temperature compensation processing is processing for suppressing and compensating the frequency fluctuation of the clock signal CK2 due to a temperature fluctuation. Hereinafter, the first temperature compensation processing and the second temperature compensation processing may be collectively referred to as a temperature compensation processing as appropriate.

Specifically, as shown in FIG. 1, the circuit device 20 includes an oscillation circuit 22 and a processing circuit 24. The oscillation circuit 22 generates the clock signal CK1 by causing the resonator 10 to oscillate. The processing circuit 24 performs the first temperature compensation processing for temperature compensating the frequency of the clock signal CK1. The processing circuit 24 is a first processing circuit.

For example, the circuit device 20 includes a first resonator terminal and a second resonator terminal. A first terminal electrode that is one end of the resonator 10 provided outside the circuit device 20 is electrically coupled to the first resonator terminal. A second terminal electrode that is the other end of the resonator 10 is electrically coupled to the second resonator terminal. The clock signal CK1 generated by the oscillation operation of the resonator 10 by the oscillation circuit 22 is output to the outside via the clock output terminal of the circuit device 20. For example, an oscillation signal from the oscillation circuit 22 is buffered by an output circuit (not shown) and output from the clock output terminal as the clock signal CK1. The first resonator terminal, the second resonator terminal, and the clock output terminal are, for example, pads of the circuit device 20. The coupling in the present embodiment is an electrical coupling. The electrical coupling is a coupling to which an electrical signal is transmittable, and a coupling that enables transmission of information by an electrical signal. The electrical coupling may be a coupling via an active element or the like.

The oscillation circuit 22 includes an oscillation drive circuit provided between the first resonator terminal and the second resonator terminal. For example, the oscillation circuit 22 can be realized by a transistor such as a bipolar transistor that realizes a drive circuit and an active element such as a capacitor or a resistor. As the oscillation circuit 22, various types of oscillation circuits can be used such as a Pierce type, a Colpitts type, an inverter type, or a Hartley type. The oscillation circuit 22 is provided with a variable capacitance circuit, and the oscillation frequency can be adjusted by adjusting a capacitance value of the variable capacitance circuit. The variable capacitance circuit can be realized by a voltage variable capacitance element such as a varactor. The variable capacitance circuit is electrically coupled to one end of the resonator 10. A first variable capacitance circuit coupled to one end of the resonator 10 and a second variable capacitance circuit electrically coupled to the other end of the resonator 10 may be provided.

The processing circuit 24 performs the first temperature compensation processing and outputs a control voltage VC that controls the oscillation of the resonator 10. For example, as the first temperature compensation processing, the processing circuit 24 generates a temperature compensated control voltage VC for compensating the frequency-temperature characteristics of the resonator 10 and outputs the control voltage VC to the oscillation circuit 22. By adjusting a capacitance value of a variable capacitance element such as a varactor of the variable capacitance circuit of the oscillation circuit 22 based on the control voltage VC, the oscillation frequency of the oscillation circuit 22 is controlled, thereby the frequency of the clock signal CK1 is controlled, and the first temperature compensation processing of the clock signal CK1 is realized. For example, the first temperature compensation processing for making the frequency change of the clock signal CK1 constant with respect to the temperature change is realized. The processing circuit 24 can be realized, for example, by an application specific integrated circuit (ASIC) using automatic placement and wiring such as a gate array. Alternatively, the processing circuit 24 may be realized by a processor such as a digital signal processor (DSP) or a central processing unit (CPU).

The circuit device 30 includes a clock signal generation circuit 32 and a processing circuit 34. The clock signal generation circuit 32 generates a clock signal CK2 having a frequency set by a frequency setting signal FSD based on the clock signal CK1 from the circuit device 20. For example, the clock signal generation circuit 32 generates the clock signal CK2 having a frequency obtained by multiplying the frequency of the clock signal CK1 using the clock signal CK1, on which the first temperature compensation processing is performed, as a reference clock signal. As will be described later, the clock signal generation circuit 32 can be realized by, for example, a fractional N type PLL circuit or a direct digital synthesizer called DDS. The clock signal CK1 is input to the circuit device 30 via a clock input terminal of the circuit device 30. The clock signal CK2 generated by the clock signal generation circuit 32 is output to the outside via the clock output terminal of the circuit device 30. For example, the clock signal CK 2 generated by the clock signal generation circuit 32 is output from the clock output terminal via an output circuit (not shown), and is output to the outside via an external terminal for external coupling of the oscillator 4. The clock input terminal and the clock output terminal are pads of the circuit device 30, for example.

The processing circuit 34 outputs a frequency setting signal FSD. The second temperature compensation processing is realized by controlling the frequency of the clock signal CK2 by the frequency setting signal FSD. For example, the second temperature compensation processing for making the frequency change of the clock signal CK2 constant with respect to the temperature change is realized. The processing circuit 34 can be realized by an ASIC circuit using automatic placement and wiring such as a gate array. Alternatively, the processing circuit 34 may be realized by a processor such as a DSP or a CPU.

Figure 5:
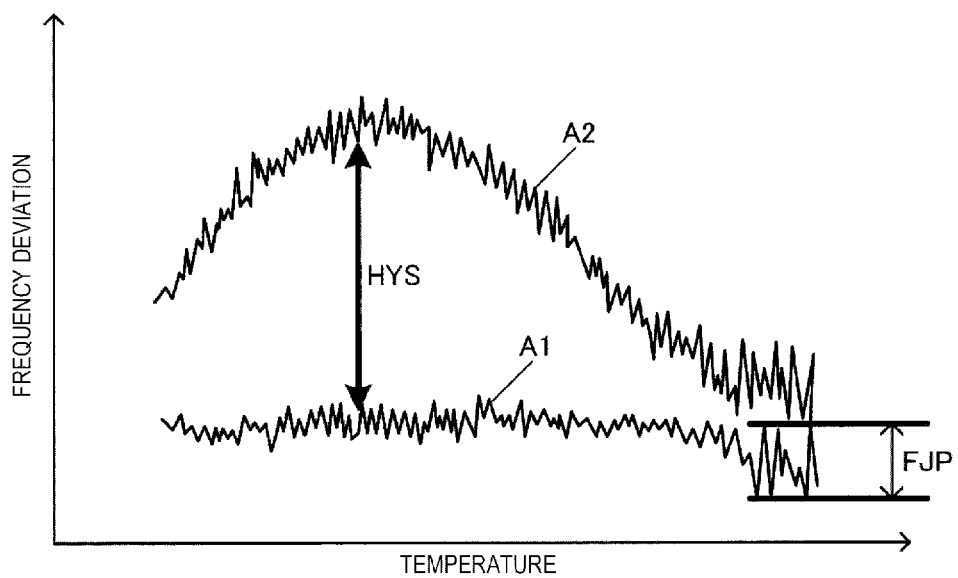
FIG. 5 shows an example of frequency-temperature characteristics explaining a problem of a micro-jump of frequency or a hysteresis error.

For example, as will be described later with reference to FIG. 8, the resonator 10 has a large frequency fluctuation amount that is a frequency fluctuation amount with respect to the temperature in the frequency-temperature characteristics. Therefore, for example, when the digital-mode temperature compensation processing is performed using the clock signal generated by the oscillation of the resonator 10 as it is, the micro-jump of frequency caused by variation of the temperature measurement result or the like becomes large, and it becomes difficult to realize the clock frequency of the oscillator 4 with high accuracy. For example, it becomes difficult to make the clock frequency with high accuracy due to the micro-jump of frequency caused by a quantization error of the temperature detection data. Note that the micro-jump in the present embodiment refers to a fine and steep frequency change with respect to a temperature change, which occurs over the entire temperature compensation range. A specific example is shown in FIG. 5 described later.

In this regard, in the present embodiment, the circuit device 20 that oscillates the resonator 10 performs the first temperature compensation processing that is a temperature compensation processing with a coarse adjustment. Thereby, the amount of frequency fluctuation in the frequency-temperature characteristics of the clock signal CK1 output from the circuit device 20 is reduced. When the circuit device 30 generates the clock signal CK2 based on the clock signal CK1 from the circuit device 20, the second temperature compensation processing that is a temperature compensation processing with a fine adjustment is performed. As described above, the second temperature compensation processing with a fine adjustment is performed by the circuit device 30 after the first temperature compensation processing with a coarse adjustment is performed by the circuit device 20, thereby it becomes possible to reduce the micro-jump of frequency caused by variation of the temperature measurement result or the like, and possible to realize the clock frequency of the oscillator 4 with high accuracy or the like. For example, in the present embodiment, an absolute value of the frequency deviation of the clock signal CK2 due to the temperature fluctuation is smaller than an absolute value of the frequency deviation of the clock signal CK1 due to the temperature fluctuation, and the amount of frequency fluctuation in the frequency-temperature characteristics of the clock signal CK2 can be made extremely small. For example, as will be described later with reference to FIG. 8, by performing the first temperature compensation processing by the circuit device 20, the absolute value of the frequency deviation of the clock signal CK1 due to the temperature fluctuation can be set to, for example, one ppm or less in a temperature range of −40° C. or more and 105° C. or less. In the present embodiment, the clock signal CK1, on which the first temperature compensation processing with a coarse adjustment where the absolute value of the frequency deviation is, for example, one ppm or less is performed, is input to the circuit device 30, the second temperature compensation processing is performed in the circuit device 30, and the clock signal CK2 is generated. As described above, the absolute value of the frequency deviation of the clock signal CK2 can be made, for example, 100 ppb or less, or may be 10 ppb or less, and it becomes possible to realize the clock frequency with high accuracy. Note that the frequency deviation referred to here is a value obtained by dividing a difference between a nominal frequency and an actual frequency by the nominal frequency.

In the present embodiment, the circuit device 20 includes an oscillation circuit 22 that generates the clock signal CK1 by causing the resonator 10 to oscillate, and a processing circuit 24 that performs the first temperature compensation processing. The circuit device 30 includes a clock signal generation circuit 32 that generates the clock signal CK2 having a frequency set by the frequency setting signal FSD based on the clock signal CK1 from the circuit device 20, and a processing circuit 34 that performs the second temperature compensation processing and outputs the frequency setting signal FSD. As described above, by providing the oscillation circuit 22 and the processing circuit 24 in the circuit device 20, it is possible to cause the circuit device 20 to perform processing of generating the clock signal CK1 by causing the resonator 10 to oscillate and to perform the first temperature compensation processing for temperature compensating the frequency of the clock signal CK1. Further, by providing the clock signal generation circuit 32 and the processing circuit 34 in the circuit device 30, it is possible to cause the circuit device 30 to perform processing of generating the clock signal CK2 based on the clock signal CK1 and to perform the second temperature compensation processing for temperature compensating the frequency of the clock signal CK2.

In the present embodiment, as the first temperature compensation processing, the processing circuit 24 of the circuit device 20 generates a temperature compensated control voltage VC for compensating the frequency-temperature characteristics of the resonator 10 and outputs the control voltage VC to the oscillation circuit 22. On the other hand, the processing circuit 34 of the circuit device 30 performs the second temperature compensation processing based on the temperature detection data, and outputs the frequency setting signal FSD that is a digital signal, to the clock signal generation circuit 32.

As described above, by controlling the oscillation frequency of the oscillation circuit 22 based on the control voltage VC generated by the first temperature compensation processing, the clock signal CK1, on which the first temperature compensation processing for compensating the frequency-temperature characteristics of the resonator 10 is performed, can be generated. The clock signal CK1 and the frequency setting signal FSD generated by the second temperature compensation processing are input to the clock signal generation circuit 32 so that the clock signal CK2, on which the second temperature compensation processing is performed, can be generated. Thereby, the second temperature compensation processing with a fine adjustment can be performed after the first temperature compensation processing with a coarse adjustment is performed, and it becomes possible to realize the clock frequency of the oscillator 4 with high accuracy.

Figure 2:
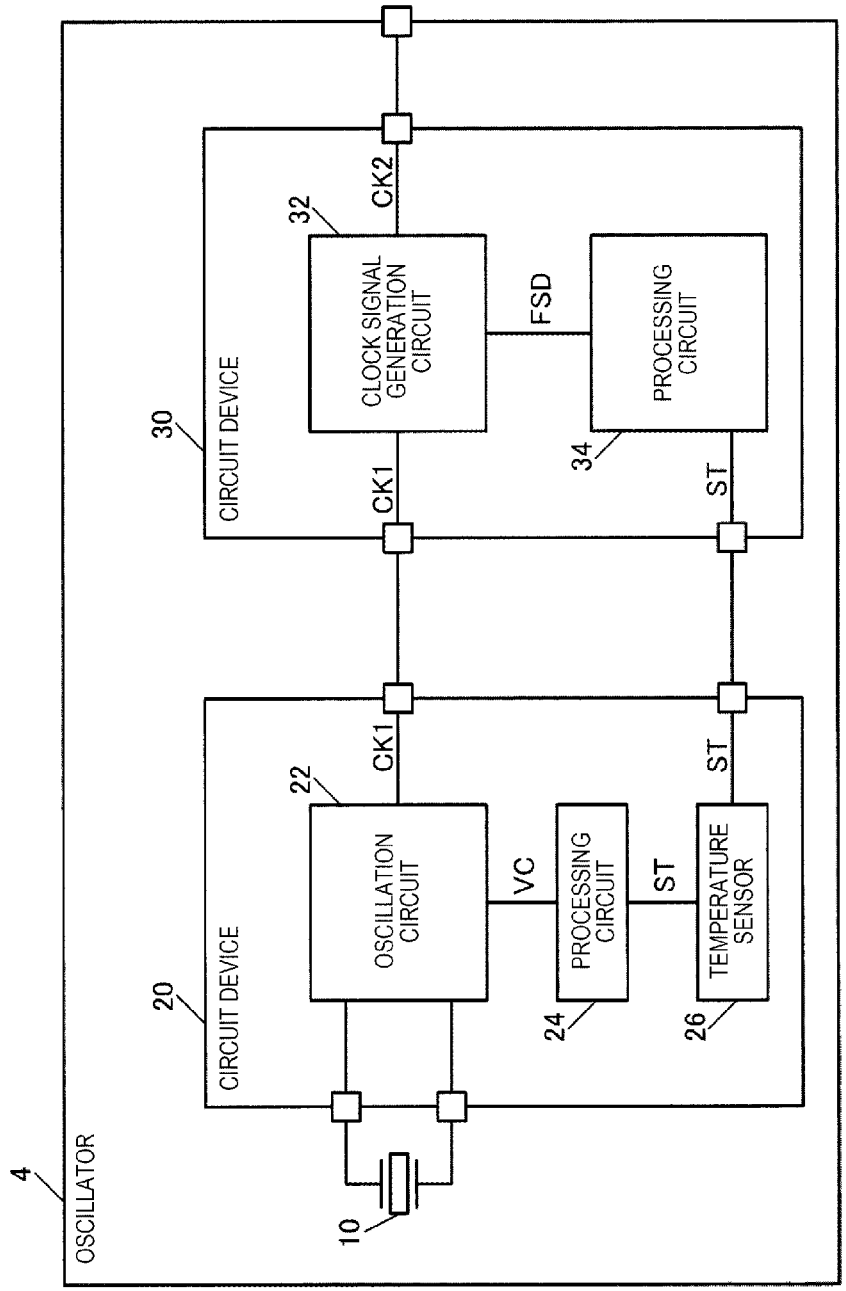
FIG. 2 shows a first configuration example of the oscillator according to the present embodiment.

FIG. 2 shows a first configuration example of the oscillator 4 according to the present embodiment. In FIG. 2, the circuit device 20 has a temperature sensor 26 and performs the first temperature compensation processing based on a temperature detection signal ST from the temperature sensor 26. The temperature detection signal ST is, for example, a temperature detection voltage. For example, the temperature sensor 26 outputs the temperature detection signal ST to the processing circuit 24. The processing circuit 24 performs the first temperature compensation processing based on the temperature detection signal ST from the temperature sensor 26. For example, the processing circuit 24 performs the first temperature compensation processing based on temperature detection data in which the temperature detection signal ST from the temperature sensor 26 is A/D converted by an A/D conversion circuit (not shown). The A/D conversion circuit may be provided outside the processing circuit 24 or may be provided inside the processing circuit 24.

The temperature sensor 26 outputs a temperature dependent voltage that is changed according to the temperature of the environment as a temperature detection signal ST. The temperature of the environment is, for example, the temperature of the environment around the resonator 10 or the circuit device 20. For example, the temperature sensor 26 generates a temperature dependent voltage using a circuit element having temperature dependency, and outputs the temperature dependent voltage with reference to a temperature independent voltage. For example, the temperature sensor 26 outputs a forward voltage of a PN bond as a temperature dependent voltage. For example, a voltage between a base and an emitter of a bipolar transistor is output as a temperature dependent voltage. The temperature independent voltage is, for example, a band gap reference voltage.

The processing circuit 24 measures the temperature of the environment using the temperature detection signal ST from the temperature sensor 26, suppresses frequency fluctuation of oscillation of the resonator 10 due to the temperature fluctuation, performs a first temperature compensation processing for compensating the frequency-temperature characteristics of the resonator 10, and outputs the control voltage VC. By controlling a capacitance value of the variable capacitance circuit included in the oscillation circuit 22 based on the control voltage VC, the first temperature compensation processing is realized in which the frequency fluctuation of the oscillation of the resonator 10 due to the temperature fluctuation is suppressed and made constant. For example, the first temperature compensation processing, in which the absolute value of the frequency deviation of the clock signal CK1 becomes one ppm or less, is realized.

By performing the first temperature compensation processing using the temperature sensor 26 built in the circuit device 20 in this way, appropriate temperature compensation of the frequency-temperature characteristics of the resonator 10 can be performed. For example, by using the temperature sensor 26 built in the circuit device 20, it is possible to measure the temperature at a place that is not so far away from the resonator 10. Thereby, since a difference between the actual temperature of the resonator 10 and the temperature measured by the temperature sensor 26 can be reduced, a more appropriate first temperature compensation processing can be realized. For example, it becomes possible to reduce a hysteresis error of the temperature characteristics.

In FIG. 2, the circuit device 30 receives the temperature detection signal ST from the temperature sensor 26 of the circuit device 20, and performs the second temperature compensation processing based on the temperature detection signal ST. For example, the temperature detection signal ST is output via the signal output terminal of the circuit device 20 and input to the circuit device 30 via the signal input terminal of the circuit device 30. The signal output terminal is, for example, a pad of the circuit device 20, and the signal input terminal is, for example, a pad of the circuit device 30. For example, the temperature detection signal ST from the circuit device 20 is input to the processing circuit 34 of the circuit device 30. The processing circuit 34 performs the second temperature compensation processing based on the temperature detection signal ST, and outputs the frequency setting signal FSD to the clock signal generation circuit 32. The clock signal generation circuit 32 generates a clock signal CK2 having a frequency set by a frequency setting signal FSD based on the clock signal CK1 from the circuit device 20. For example, the clock signal generation circuit 32 generates the clock signal CK2 having a frequency set by the frequency setting signal FSD using the clock signal CK1 as a reference clock signal. The generated clock signal CK2 is output from the oscillator 4.

As described above, in FIG. 2, the circuit device 30 performs the second temperature compensation processing based on the temperature detection signal ST from the temperature sensor 26 of the circuit device 20. As described above, the first temperature compensation processing in the circuit device 20 and the second temperature compensation processing in the circuit device 30 can be performed based on the temperature detection signal ST from the same temperature sensor 26 so that more appropriate temperature compensation processing can be realized. Further, by using the temperature sensor 26 built in the circuit device 20, it is possible to increase a distance between the temperature sensor 26 and the circuit device 30. For example, the distance between the temperature sensor 26 and the resonator 10 can be made shorter than the distance between the temperature sensor 26 and the circuit device 30. For example, since the circuit device 30 performs the digital-mode temperature compensation processing, the amount of heat generated by the digital processing increases. By making the distance between the circuit device 30 serving as a heat source and the temperature sensor 26 longer than the distance between the resonator 10 and the temperature sensor 26, adverse effects due to heat generated by the circuit device 30 can be reduced. Specifically, it becomes possible to greatly reduce the hysteresis error of the temperature characteristics as will be described later, and it is possible to realize the clock frequency of the oscillator 4 with high accuracy.

Figure 3:
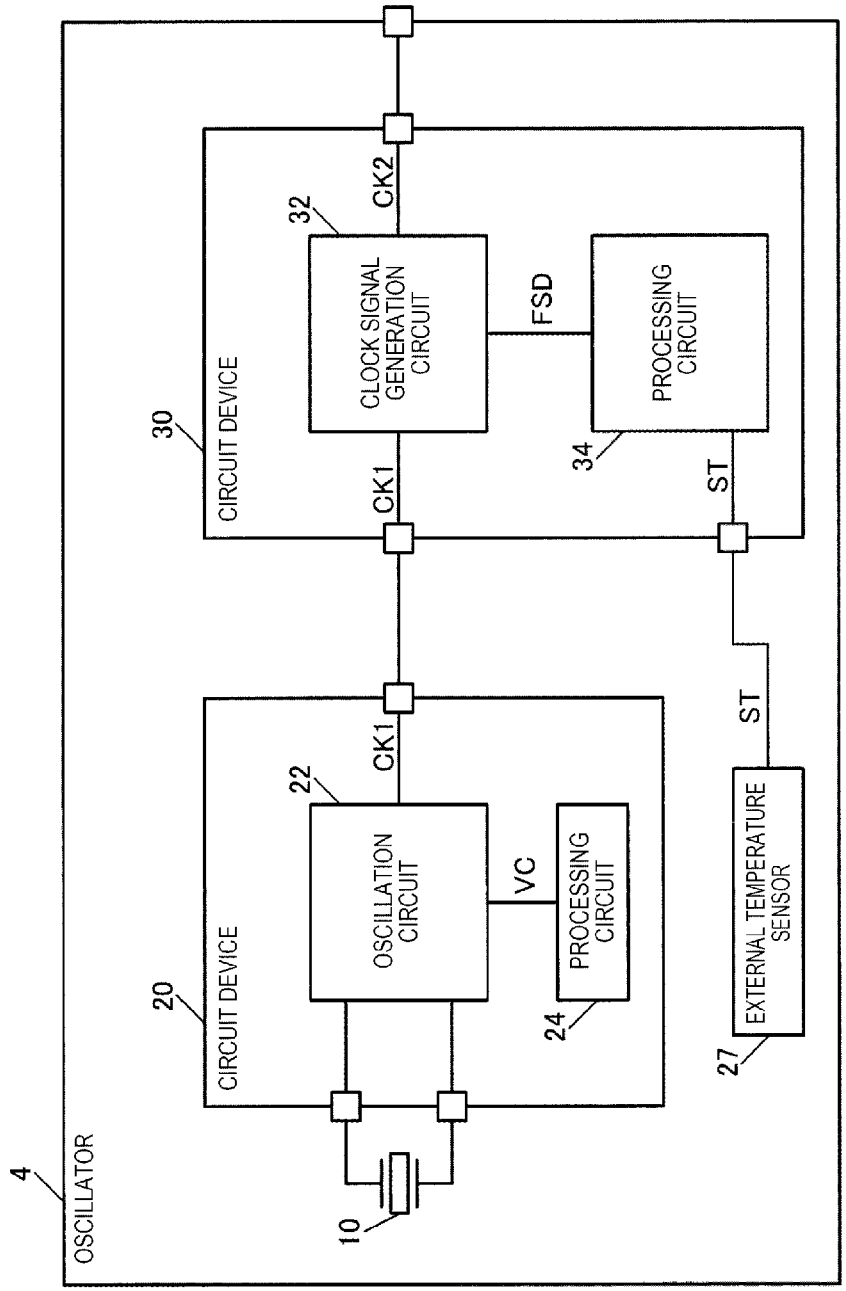
FIG. 3 shows a second configuration example of the oscillator according to the present embodiment.

FIG. 3 shows a second configuration example of the oscillator 4 according to the present embodiment. In FIG. 3, the circuit device 30 receives the temperature detection signal ST from the circuit device 20 and the external temperature sensor 27 provided outside the circuit device 30, and performs the second temperature compensation processing based on the temperature detection signal ST. For example, the temperature detection signal ST from the external temperature sensor 27 is input to the circuit device 30 via the signal input terminal of the circuit device 30. For example, the temperature detection signal ST from the external temperature sensor 27 is input to the processing circuit 34 of the circuit device 30. The processing circuit 34 performs the second temperature compensation processing based on the temperature detection signal ST, and outputs the frequency setting signal FSD to the clock signal generation circuit 32. For example, the processing circuit 34 performs the second temperature compensation processing based on temperature detection data in which the temperature detection signal from the external temperature sensor 27 is A/D converted by the A/D conversion circuit (not shown). The clock signal generation circuit 32 generates a clock signal CK2 having a frequency set by a frequency setting signal FSD based on the clock signal CK1 from the circuit device 20.

The external temperature sensor 27 is mounted inside the package of the oscillator 4, for example. As the external temperature sensor 27, for example, various temperature detection elements realized by circuit components such as a thermistor can be used. Further, the circuit device 20 may perform the first temperature compensation processing based on the temperature detection signal ST from the external temperature sensor 27, or perform the first temperature compensation processing based on the temperature detection signal ST from the temperature sensor 26 built in the circuit device 20. The circuit device 20 may perform the first temperature compensation processing using both the built-in temperature sensor 26 and the external temperature sensor 27. The circuit device 30 may also perform the second temperature compensation processing using both the temperature sensor 26 built in the circuit device 20 and the external temperature sensor 27. Alternatively, the circuit device 30 may perform the second temperature compensation processing using the temperature sensor built in the circuit device 30. Further, a plurality of temperature sensors may be provided as the external temperature sensor 27, and the first temperature compensation processing and the second temperature compensation processing may be performed using the plurality of temperature sensors. Alternatively, a plurality of temperature sensors may be provided in the circuit device 20 or the circuit device 30, and the first temperature compensation processing and the second temperature compensation processing may be performed using the plurality of temperature sensors.

As described above, in FIG. 3, the temperature compensation processing such as the second temperature compensation processing is performed based on the temperature detection signal ST from the external temperature sensor 27. As described above, for example, by disposing the external temperature sensor 27 closer to the resonator 10, the temperature around the resonator 10 can be measured more appropriately. Thereby, it becomes possible to realize a more appropriate temperature compensation processing with high accuracy. For example, by providing a plurality of temperature sensors in the package of the oscillator 4 as the external temperature sensor 27, it becomes possible to realize the temperature compensation processing with higher accuracy.

Figure 4:
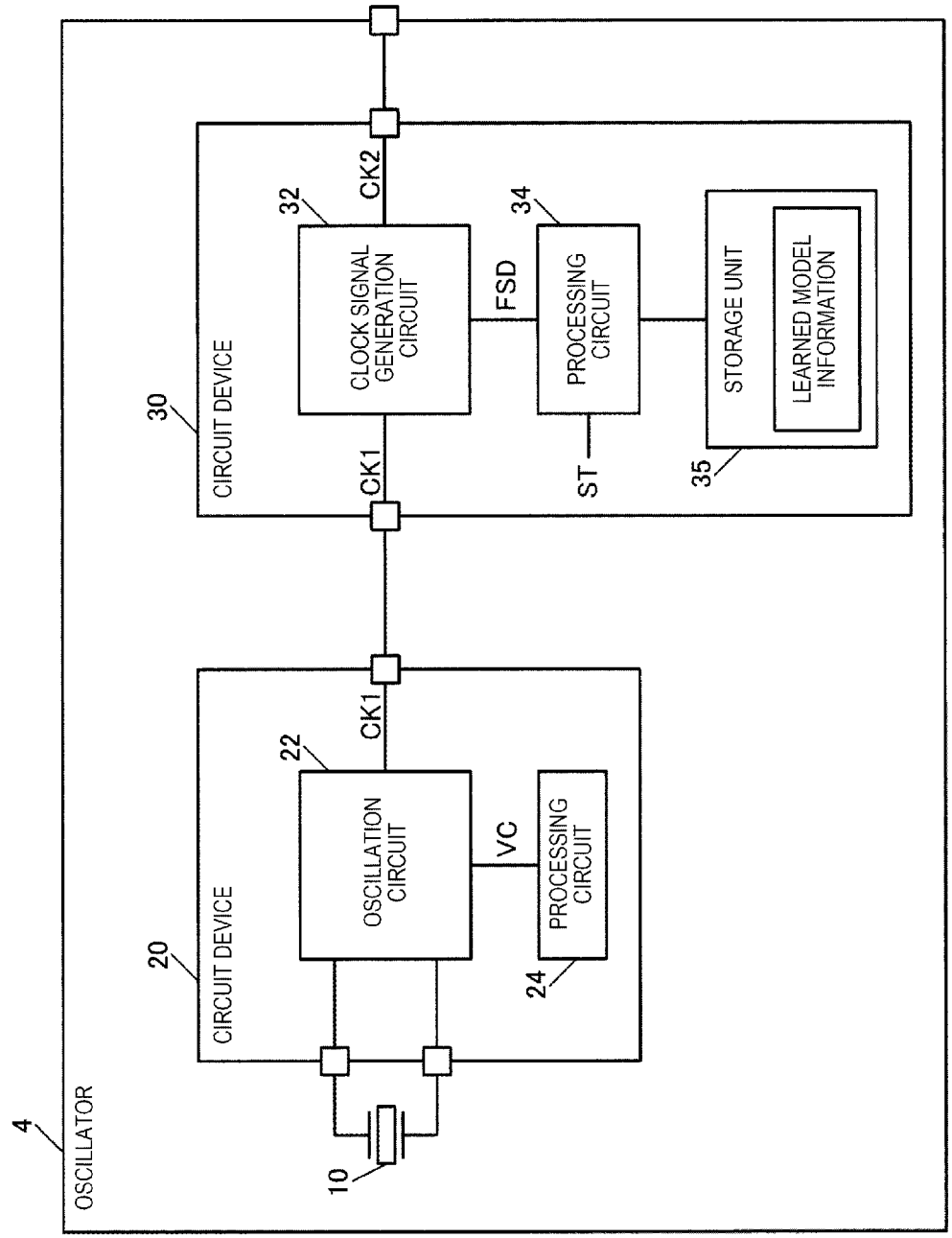
FIG. 4 shows a third configuration example of the oscillator according to the present embodiment.

FIG. 4 shows a third configuration example of the oscillator 4 according to the present embodiment. In FIG. 4, the circuit device 30 includes a storage unit 35 that stores learned model information. The processing circuit 34 performs the second temperature compensation processing based on the learned model information. For example, the processing circuit 34 performs the second temperature compensation processing based on the temperature detection signal ST and the learned model information stored in the storage unit 35. The frequency setting signal FSD, on which the temperature compensation processing is performed, is output. The storage unit 35 can be realized by a semiconductor memory such as a non-volatile memory, for example. As the non-volatile memory, an electrically erasable programmable read-only memory (EEPROM) capable of electrical erasure of data, or an one time programmable (OTP) memory or the like using a floating gate avalanche injection MOS (FAMOS) or the like can be used.

The temperature detection signal ST may be a temperature detection signal from the temperature sensor 26 built in the circuit device 20, or may be a temperature detection signal from the external temperature sensor 27. Alternatively, the temperature detection signal ST may be a temperature detection signal from a temperature sensor (not shown) built in the circuit device 30. Alternatively, the processing circuit 34 may perform the second temperature compensation processing based on the temperature detection signals ST from a plurality of temperature sensors such as the temperature sensor 26 and the external temperature sensor 27, and the learned model information stored in the storage unit 35. For example, the storage unit 35 stores the learned model information which is machine-learned so as to obtain a corresponding temperature compensation value with respect to the temperature measurement result. The processing circuit 34 performs the second temperature compensation processing for obtaining a temperature compensation value corresponding to each temperature based on the temperature detection signal ST and the learned model information in the storage unit 35. When the processing circuit 34 performs the neural network calculation, the storage unit 35 stores information about the weighting coefficient of the neural network calculation as the learned model information. For example, the processing circuit 34 reads information about the weighting coefficient from the storage unit 35 based on the temperature detection data corresponding to the temperature detection signal ST, performs a neural network calculation, and executes the second temperature compensation processing for obtaining a temperature compensation value corresponding to each temperature.

As described above, by performing the second temperature compensation processing using the learned model information, it is possible to realize a more accurate and appropriate second temperature compensation processing. For example, at the time of manufacture or shipment of the oscillator 4, the learned model information obtained by measuring the frequency-temperature characteristics of the oscillator 4 is written and stored in the storage unit 35 which is realized by a non-volatile memory or the like. For example, at the time of manufacture or shipment of the oscillator 4, the frequency characteristics of the clock signal at each temperature is measured while changing the environmental temperature using a constant temperature oven or the like. Thereafter, the learned model information obtained based on the measurement result is written and stored in the storage unit 35. For example, the clock frequency and the temperature detection signal at each temperature are monitored, and learned model information, which is machine-learned so as to obtain an appropriate temperature compensation value corresponding to the value of the temperature detection signal at each temperature, is written and stored in the storage unit 35. As described above, during the actual operation of the oscillator 4, the processing circuit 34 can execute the second temperature compensation processing for obtaining temperature compensation data corresponding to the temperature detection signal from the temperature sensor. As a result, it is possible to realize the second temperature compensation processing in which an affection such as a change in manufacturing process or a change in circuit characteristics is suppressed and canceled. The oscillator 4 according to the present embodiment is not limited to the configuration described with reference to FIGS. 1 to 4, and various modifications can be made. For example, the circuit device 20 and the circuit device 30 can be modified so as to be realized by one semiconductor chip. Further, the circuit device 20 may be provided with a plurality of temperature sensors, the circuit device 30 may be provided with one or a plurality of temperature sensors, or a plurality of external temperature sensors realized by discrete components may be provided in the oscillator 4. The learned model information may be updated after the oscillator 4 is shipped. The second temperature compensation processing based on the learned model information only needs to operate in a state where the oscillator 4 is mounted. The configuration for performing the second temperature compensation processing is not necessarily limited to that accommodated in the same package as other circuit elements, and may be provided outside the package of the oscillator 4.

2. Temperature Compensation Processing

Next, the temperature compensation processing of the present embodiment will be described in detail. For example, in the frequency-temperature characteristics in FIG. 5, the horizontal axis indicates the temperature, and the temperature is changed in a temperature range of −40° C. or more and 80° C. or less, −40° C. or more and 105° C. or less, or −40° C. or more and 125° C. or less. The vertical axis indicates the frequency deviation represented in units such as ppb. The same applies to the subsequent drawings.

A1 in FIG. 5 indicates frequency-temperature characteristics when the temperature is raised from the low temperature to high temperature in the oscillator in the related art, and A2 indicates frequency-temperature characteristics when the temperature is lowered from the high temperature to low temperature. When the temperature is raised as in A1 in FIG. 5, the frequency fluctuation due to the temperature fluctuation is relatively small. However, when the temperature is lowered after the temperature rise as in A2, a hysteresis error HYS occurs. That is, when the temperature of the IC of the circuit device rises due to the temperature rise, even if the temperature is lowered thereafter, the temperature of the circuit device does not drop immediately but remains high. Therefore, when the temperature compensation processing is performed using the temperature sensor built in the circuit device, the temperature compensation processing is performed with a temperature detection signal different from the actual temperature of the resonator or the temperature of the environment, thereby the hysteresis error HYS as shown in FIG. 5 occurs. Further, in FIG. 5, a micro-jump of frequency FJP caused by variation of the temperature measurement result or the like also occurs. When such a micro-jump FJP or hysteresis error HYS occurs, it becomes difficult to keep the frequency deviation due to temperature fluctuation within the frequency tolerance that is the specification of the oscillator.

Figure 6:
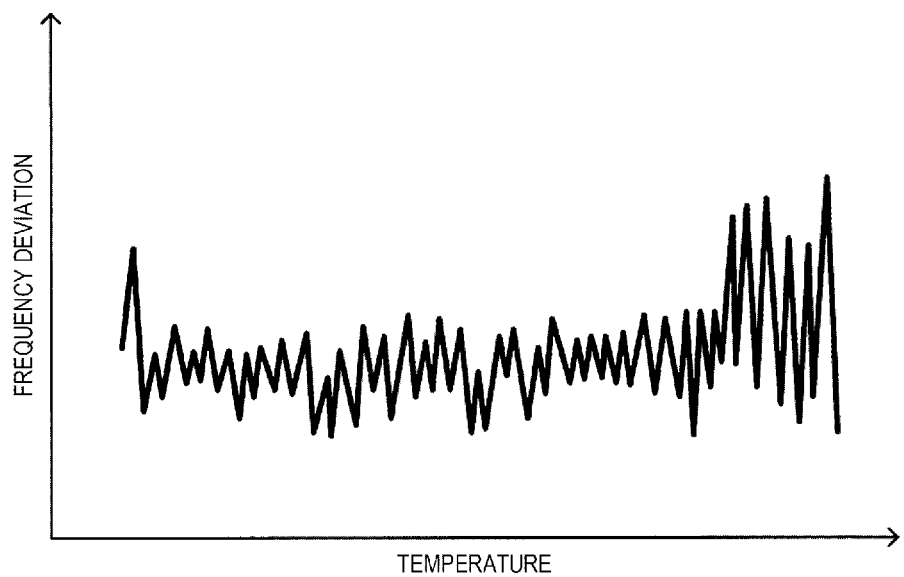
FIG. 6 shows an example of the frequency-temperature characteristics when a micro-jump of frequency occurs.
Figure 7:
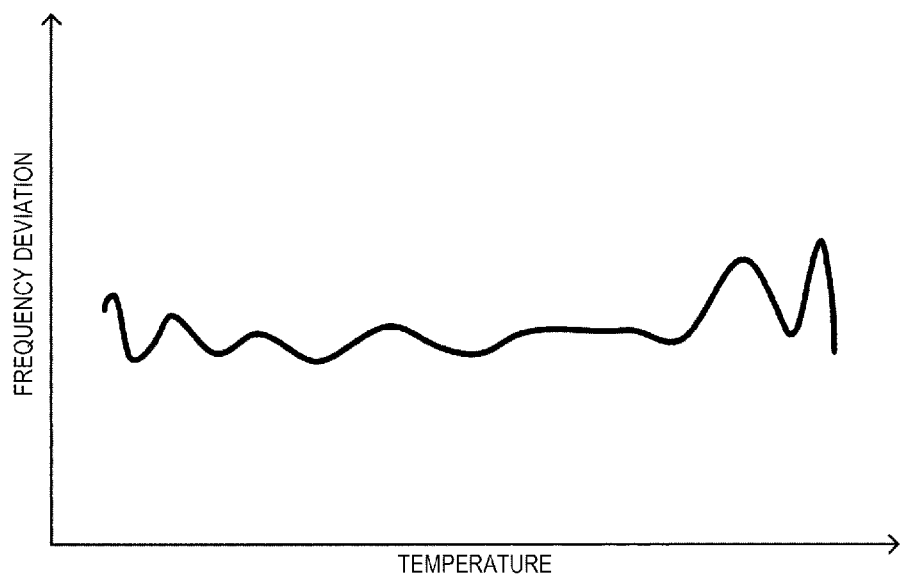
FIG. 7 shows an example of the frequency-temperature characteristics when a micro-jump of frequency is suppressed.

FIG. 6 shows an example of the frequency-temperature characteristics when a micro-jump of frequency occurs. When a large micro-jump occurs as shown in FIG. 6, the slope of the frequency-temperature characteristics deteriorates and the performance of the oscillator deteriorates. On the other hand, by suppressing the micro-jump as shown in FIG. 7, it is possible to realize the clock frequency of the oscillator with high accuracy.

Figure 8:
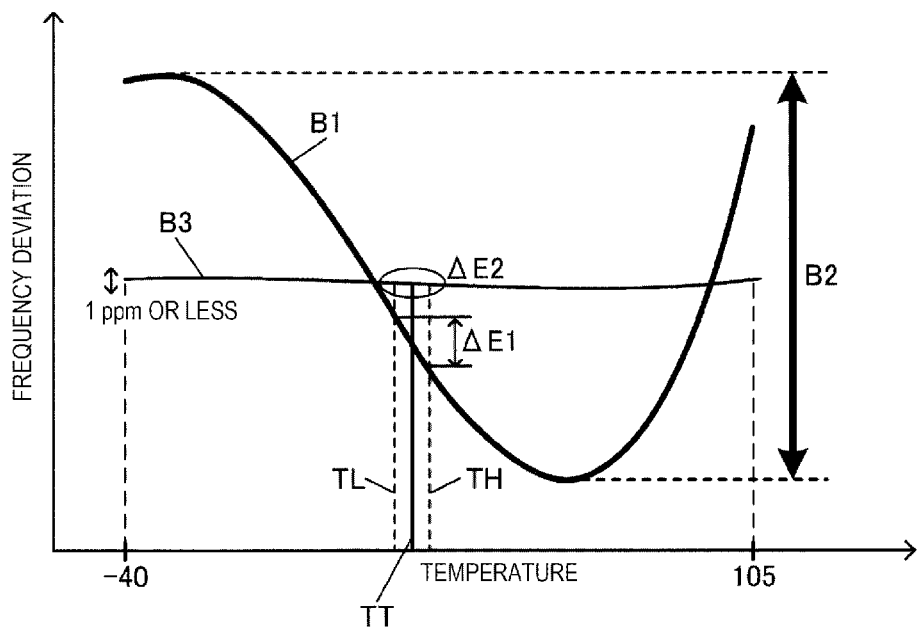
FIG. 8 is an explanatory diagram of a temperature compensation technique according to the present embodiment.

B1 in FIG. 8 indicates frequency-temperature characteristics of the resonator 10 such as a crystal resonator. In the temperature compensation processing, compensation processing for canceling the frequency-temperature characteristics of the resonator 10 shown in B1 is performed. Therefore, as shown in B2, it is necessary to perform the temperature compensation processing in a wide correction range of, for example, 20 ppm to 40 ppm. On the other hand, there is variation in the temperature measurement result using the temperature sensor. For example, TT in FIG. 8 indicates a true value temperature, and the temperature measurement result has variation as shown in TL to TH. The variation occurs due to variation in the outside air temperature, variation in the detection of the temperature sensor, variation in the time difference in heat transfer to the resonator 10, variation in the A/D conversion of the temperature detection signal, or the like. When the variation in the temperature detection result as shown in TL to TH occurs, the correction error $\Delta E1$ caused by the variation becomes large. For example, if the frequency-temperature characteristics of the resonator 10 as shown in B1 is to be compensated by one time temperature compensation processing within a wide correction range as shown in B2, the correction error $\Delta E1$ is caused, and a micro-jump of frequency FJP as shown in FIGS. 5 and 6 occurs. For example, the second temperature compensation processing that is the digital-mode temperature compensation processing, is performed based on the digital temperature detection data obtained by A/D converting the temperature detection signal. Therefore, there is a quantization error in the A/D conversion of the temperature detection signal, and when the second temperature compensation processing is directly performed with respect to the frequency-temperature characteristics of B1 in FIG. 8, the correction error due to the quantization error becomes large as $\Delta E1$ in FIG. 8.

Figure 9:
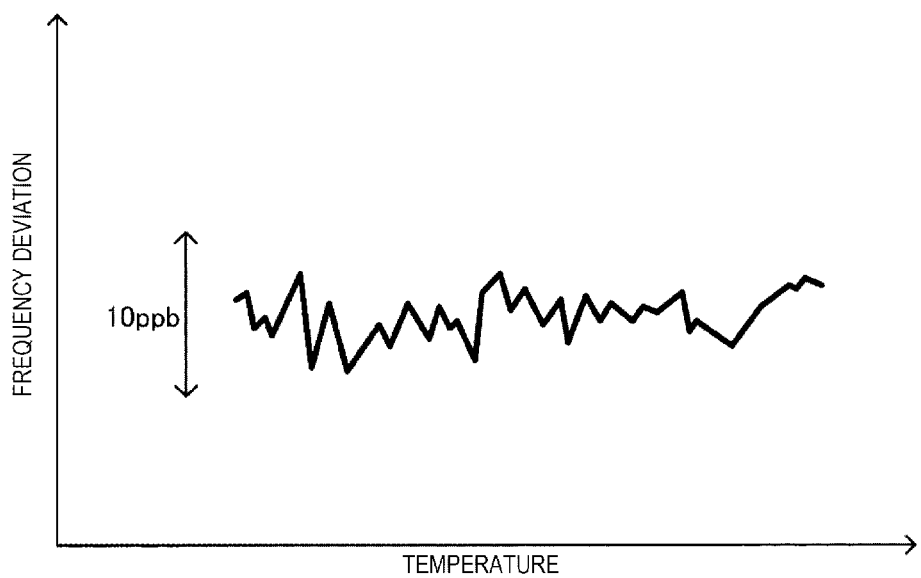
FIG. 9 is an explanatory diagram of frequency deviation improvement using the temperature compensation technique according to the present embodiment.

In this regard, in the present embodiment, the circuit device 20 performs the first temperature compensation processing with a coarse adjustment. By performing such first temperature compensation processing, as shown in B3 in FIG. 8, the absolute value of the frequency deviation of the clock signal CK1 due to the temperature fluctuation can be set to, for example, one ppm or less in a temperature range of −40° C. or more and 105° C. or less. Therefore, even when the variation in the temperature measurement result occurs as shown in TL to TH, the correction error $\Delta E2$ can be made extremely small. That is, in the present embodiment, the clock signal CK1 on which the first temperature compensation processing with a coarse adjustment is input to the circuit device 30, and the second temperature compensation processing with a fine adjustment is performed in the circuit device 30, then the clock signal CK2 is generated. Therefore, since the clock signal CK1 having the frequency-temperature characteristics as shown in B3 in FIG. 8 is input to the circuit device 30, the circuit device 30 does not need to perform the temperature compensation processing in the wide correction range as shown in B2, and only needs to perform the temperature compensation processing in a narrow correction range. Therefore, the correction error $\Delta E2$ can be reduced even when the variation of the temperature measurement result occurs. For example, the correction error due to the quantization error in the A/D conversion of the temperature detection signal can be reduced as $\Delta E2$ in FIG. 8, so that the clock frequency can be highly accurate. For example, the absolute value of the frequency deviation of the clock signal CK2 due to temperature fluctuation can be made sufficiently smaller than the absolute value of the frequency deviation of the clock signal CK1 due to temperature fluctuation. Thereby, the absolute value of the frequency deviation of the clock signal CK2 can be set to 100 ppb or less, for example. Specifically, as shown in FIG. 9, the absolute value of the frequency deviation of the clock signal CK2 can be set to 10 ppb or less, and it is possible to realize the clock frequency with high accuracy.

Figure 10:
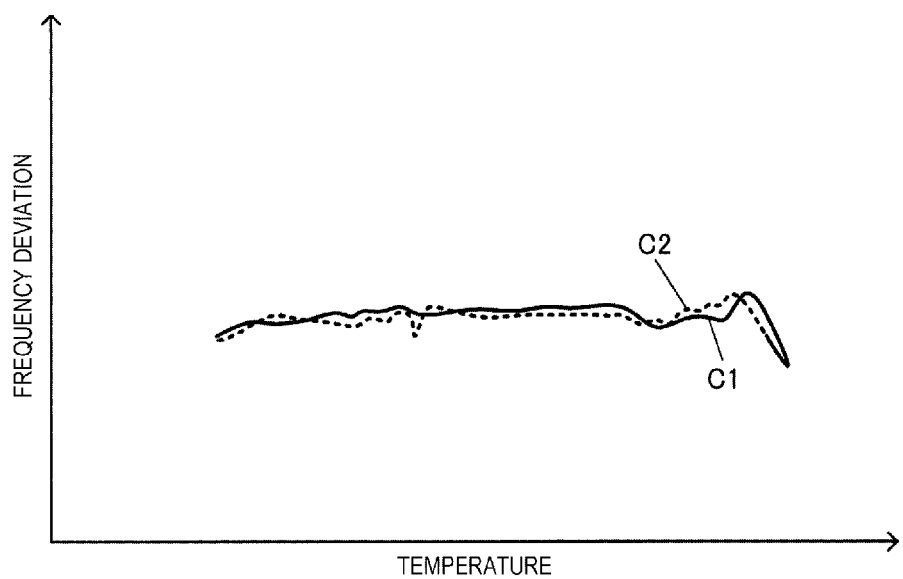
FIG. 10 is an explanatory diagram of hysteresis characteristic improvement using the temperature compensation technique according to the present embodiment.

In the present embodiment, as shown in FIG. 2, the circuit device 30 performs the second temperature compensation processing based on the temperature detection signal ST from the temperature sensor 26 of the circuit device 20. As described above, for example, by performing the digital-mode second temperature compensation processing, even when the circuit device 30 generates heat, it is possible to suppress the adverse effects of the generated heat from reaching the temperature detection result of the temperature sensor 26. For example, the distance between the temperature sensor 26 and the resonator 10 can be made shorter than the distance between the temperature sensor 26 and the circuit device 30, and the temperature of the resonator 10 can be more appropriately measure using the temperature sensor 26. For example, since the distance between the temperature sensor 26 and the circuit device 30 can be increased, it is possible to suppress the adverse effects of the heat generated by the circuit device 30 from reaching the temperature detection result of the temperature sensor 26. As a result, the hysteresis error HYS described in FIG. 5 can be greatly reduced. For example, C1 in FIG. 10 indicates frequency-temperature characteristics when the temperature is raised from the low temperature to high temperature in the oscillator 4 according to the present embodiment, and C2 indicates frequency-temperature characteristics when the temperature is lowered from the high temperature to low temperature. As shown in FIG. 10, according to the oscillator 4 of the present embodiment, the hysteresis error can be greatly reduced as compared with FIG. 5, and the clock frequency of the oscillator 4 can be realized with high accuracy.

3. Circuit Device

Figure 11:
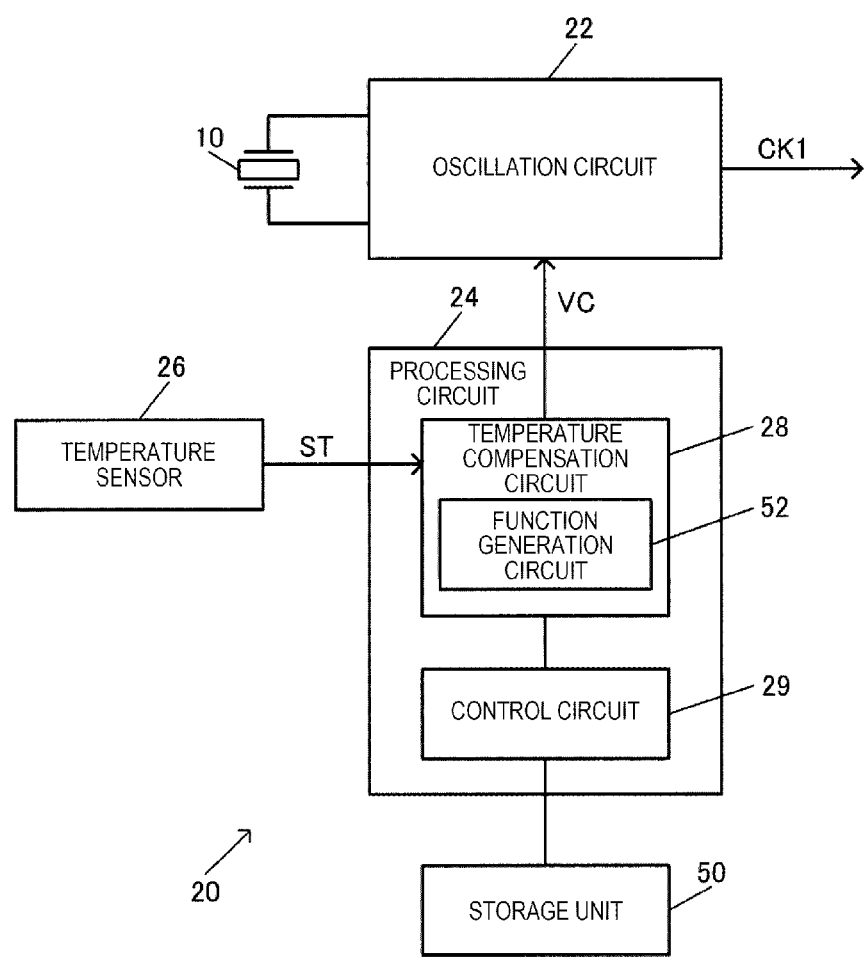
FIG. 11 shows a first configuration example of a first circuit device.

FIG. 11 shows a first configuration example of the circuit device 20 that is the first circuit device. As shown in FIG. 11, the circuit device 20 includes an oscillation circuit 22 that generates the clock signal CK1 by causing the resonator 10 to oscillate, and a processing circuit 24 that performs the first temperature compensation processing. In FIG. 11, the circuit device 20 includes a temperature sensor 26 and a storage unit 50. The storage unit 50 can be realized by a memory such as a non-volatile memory, for example.

In FIG. 11, as the first temperature compensation processing, the processing circuit 24 generates a temperature compensated control voltage VC for compensating the frequency-temperature characteristics of the resonator 10 and outputs the control voltage VC to the oscillation circuit. For example, function generation processing for compensating the frequency-temperature characteristics of the resonator 10 by using the polynomial approximation is performed as the first temperature compensation processing, and the control voltage VC for temperature compensation is output to the oscillation circuit 22. The oscillation circuit 22 includes, for example, a variable capacitance circuit which is electrically coupled to one end of the resonator 10, and a capacitance value of the variable capacitance circuit is controlled based on the control voltage VC. Thereby, the clock signal CK1, on which the first temperature compensation processing is performed, is output from the circuit device 20. That is, as shown in B3 in FIG. 8, the clock signal CK1 is output so that the absolute value of the frequency deviation due to the temperature fluctuation becomes one ppm or less in the temperature range of −40° C. or more and 105° C. or less.

Specifically, the processing circuit 24 includes a temperature compensation circuit 28 and a control circuit 29, and the temperature compensation circuit 28 includes a function generation circuit 52. The control circuit 29 controls the reading of data from the storage unit 50 and the temperature compensation circuit 28. The function generation circuit 52 performs a function generation processing for compensating the frequency-temperature characteristics of the resonator 10 by using the polynomial approximation. The storage unit 50 stores polynomial coefficient data in the polynomial approximation. For example, the function generation circuit 52 includes a zero-th order component generation circuit, a first order component generation circuit, and a third order component generation circuit. The function generation circuit 52 can include a high order component generation circuit. The high order component is a fourth or higher order component. The zero-th order component generation circuit outputs a zero-th order component signal that approximates the zero-th order component of the frequency-temperature characteristics of the resonator 10 based on the coefficient data for the zero-th order component which is read from the storage unit 50. The first order component generation circuit, the third order component generation circuit, and the high order component generation circuit are respectively output a first order component signal approximating the first order component, a third order component signal approximating the third order component, a high order component signal approximating the high order component of the frequency-temperature characteristics of the resonator 10 based on the coefficient data for the first order component, the third order component, and the high order component which are read from the storage unit 50, respectively. The temperature compensation circuit 28 performs addition processing of these zero-th order component signal, first order component signal, third order component signal, and high order component signal, so that the control voltage VC for compensating the frequency-temperature characteristics of the resonator 10 is generated. According to the circuit device 20 in FIG. 11 having such a configuration, analog-mode first temperature compensation processing using the polynomial approximation can be realized.

Figure 12:
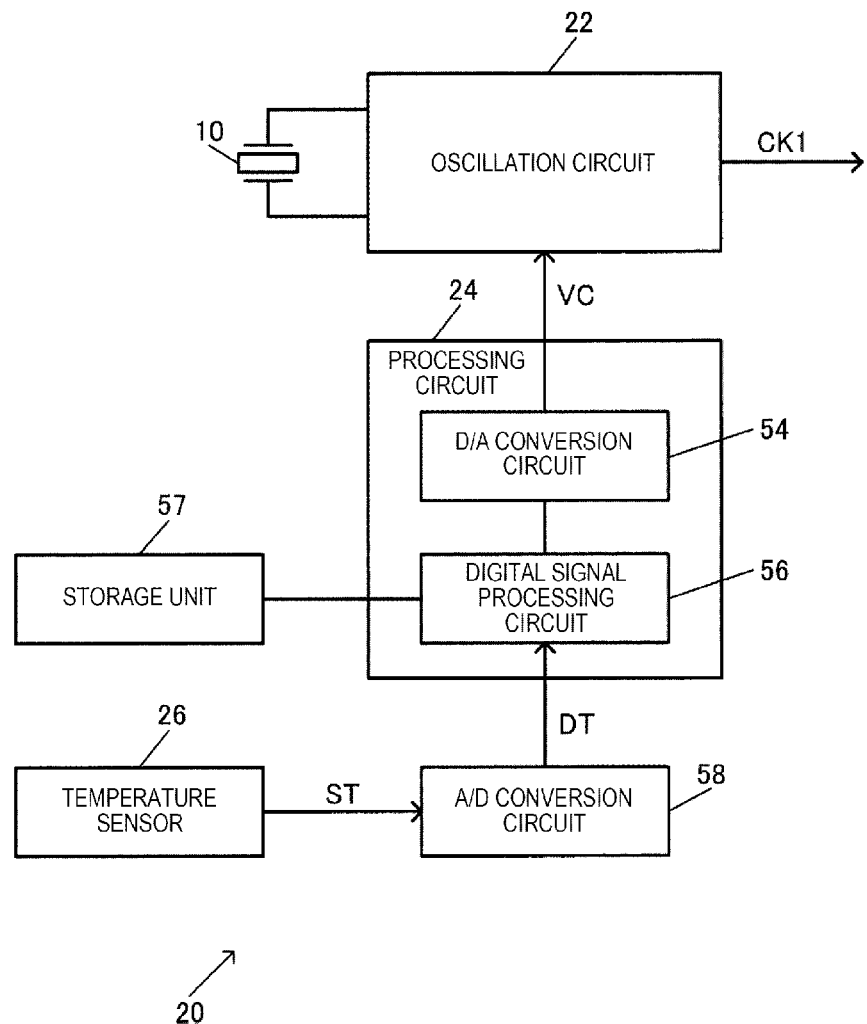
FIG. 12 shows a second configuration example of the first circuit device.

FIG. 12 shows a second configuration example of the circuit device 20. As shown in FIG. 12, the circuit device 20 includes an oscillation circuit 22 that generates the clock signal CK1 by causing the resonator 10 to oscillate, and a processing circuit 24 that performs the first temperature compensation processing. In FIG. 12, the circuit device 20 includes a temperature sensor 26, a storage unit 57, and an A/D conversion circuit 58. The storage unit 57 can be realized by a memory such as a non-volatile memory, for example. The A/D conversion circuit 58 performs an A/D conversion of the temperature detection voltage that is a temperature detection signal ST from the temperature sensor 26 and outputs temperature detection data DT to the processing circuit 24. As the first temperature compensation processing, the processing circuit 24 generates a temperature compensated control voltage VC for compensating the frequency-temperature characteristics of the resonator 10 and outputs the control voltage VC to the oscillation circuit. The capacitance value of the variable capacitance circuit of the oscillation circuit 22 is controlled based on the control voltage VC, thereby the clock signal CK1, on which the first temperature compensation processing is performed, is output from the circuit device 20.

Specifically, the processing circuit 24 includes a digital signal processing circuit 56 and a D/A conversion circuit 54. The digital signal processing circuit 56 performs the first temperature compensation processing based on the coefficient data for the temperature compensation processing which is read from the storage unit 57. For example, based on the temperature detection data DT that changes according to the temperature, and coefficient data of a polynomial in polynomial approximation, the digital signal processing circuit 56 performs the first temperature compensation processing for making the oscillation frequency of the resonator 10 constant even when the temperature changes, and generates frequency control data. The D/A conversion circuit 54 performs a D/A conversion of the frequency control data from the digital signal processing circuit 56 and outputs the control voltage VC for the temperature compensation to the oscillation circuit 22. Thereby, the clock signal CK1, on which the first temperature compensation processing is performed, is output from the circuit device 20.

Figure 13:
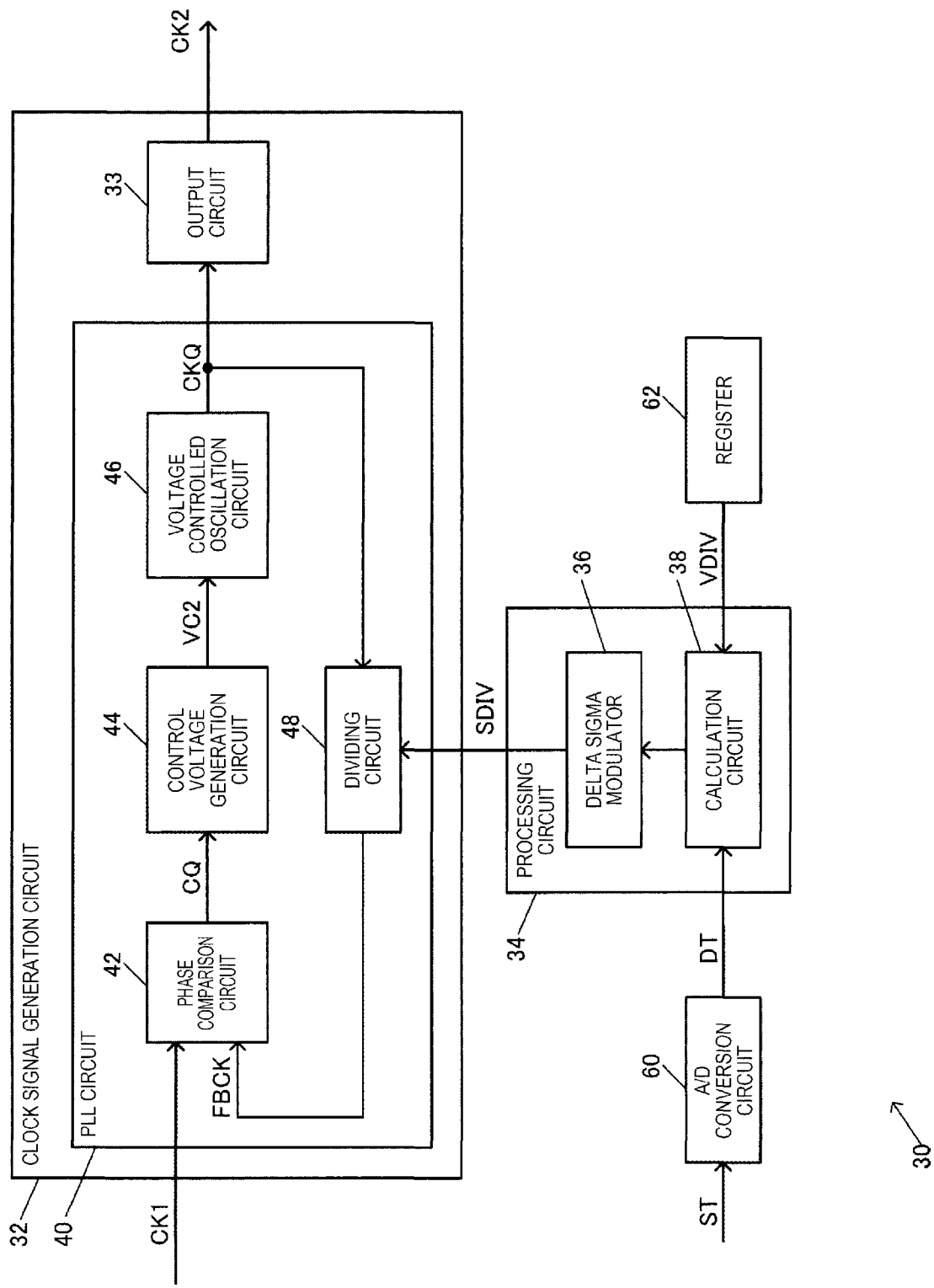
FIG. 13 shows a first configuration example of a second circuit device.

FIG. 13 shows a first configuration example of the circuit device 30 that is the second circuit device. In FIG. 13, the circuit device 30 includes a clock signal generation circuit 32, a processing circuit 34, an A/D conversion circuit 60, and a register 62. The A/D conversion circuit 60 performs the A/D conversion of the temperature detection signal ST and outputs the digital temperature detection data DT. The register 62 stores a division ratio setting value VDIV. The register 62 can be realized by a flip-flop circuit, for example. Alternatively, the register 62 may be realized by a memory such as a RAM. The processing circuit 34 performs the second temperature compensation processing based on the temperature detection data DT, and outputs the division ratio setting signal SDIV to the clock signal generation circuit 32 as the frequency setting signal FSD of the digital signal described with reference to FIGS. 1 to 4. For example, the processing circuit 34 outputs the division ratio setting signal SDIV that generates the clock signal CK2, on which the second temperature compensation processing is performed, to the clock signal generation circuit 32 based on the temperature detection data DT from the A/D conversion circuit 60 and the division ratio setting value VDIV from the register 62.

The clock signal generation circuit 32 includes a PLL circuit 40 to which the clock signal CK1 is input as a reference clock signal. The PLL circuit 40 is, for example, a fractional N type PLL circuit. The frequency setting signal FSD described with reference to FIGS. 1 to 4 is the division ratio setting signal SDIV of the dividing circuit 48 included in the PLL circuit 40. The dividing circuit 48 performs dividing processing with a division ratio set by the division ratio setting signal SDIV.

As described above, in FIG. 13, the clock signal generation circuit 32 includes the fractional N type PLL circuit 40 to which the clock signal CK1 is input as the reference clock signal. Further, the division ratio setting signal SDIV is input to the dividing circuit 48 of the PLL circuit 40 as the frequency setting signal FSD. As described above, the division ratio setting signal SDIV, on which the second temperature compensation processing is performed, is input to the dividing circuit 48 of the PLL circuit 40, a PLL operation for multiplying the frequency of the clock signal CK1 is realized, and the clock signal CK2 based on the signal obtained by multiplying the frequency of the clock signal CK1 can be generated. Thereby, the clock signal CK2, on which the second temperature compensation processing is performed, can be generated based on the clock signal CK1. Further, by using the fractional N type PLL circuit 40, not only an integer but also a fraction can be set as a division ratio of the PLL circuit 40, and a clock signal CK2 having any frequency can be generated.

Next, the configuration of the circuit device 30 in FIG. 13 will be described in more detail. In FIG. 13, the clock signal generation circuit 32 includes a PLL circuit 40 and an output circuit 33.

The output circuit 33 outputs the clock signal CK2 based on a clock signal CKQ which is output from the PLL circuit 40. For example, the output circuit 33 includes a dividing circuit (not shown), and can variably set the frequency of the clock signal CK2 by dividing the frequency of the clock signal CKQ by the dividing circuit. Thereby, the frequency of the clock signal CK2 can be set to a frequency desired by a user. Further, the output circuit 33 outputs the clock signal CK2 to the outside in a signal format such as a low voltage differential signaling (LVDS), a positive emitter coupled logic (PECL), an high speed current steering logic (HCSL), or a differential complementary MOS (CMOS). For example, the output circuit 33 may be a circuit that can output the clock signal CK2 in at least two signal formats of LVDS, PECL, HCSL, and differential CMOS. In this case, the output circuit 33 outputs the clock signal CK2 in the signal format set by the processing circuit 34.

The PLL circuit 40 receives the clock signal CK1 as a reference clock signal and performs a phase locked loop (PLL) operation. For example, the PLL circuit 40 generates a clock signal CKQ having a frequency obtained by multiplying the frequency of the clock signal CK1. That is, a highly accurate clock signal CKQ that is phase synchronized with the clock signal CK1 is generated. The PLL circuit 40 includes a phase comparison circuit 42, a control voltage generation circuit 44, a voltage controlled oscillation circuit 46, and a dividing circuit 48.

The phase comparison circuit 42 performs a phase comparison between the clock signal CK1 that is the reference clock signal and a feedback clock signal FBCK. For example, the phase comparison circuit 42 compares the phases of the clock signal CK1 and the feedback clock signal FBCK, and outputs a signal CQ corresponding to a phase difference between the clock signal CK1 and the feedback clock signal FBCK as a signal of a phase comparison result. The signal CQ corresponding to the phase difference is, for example, a pulse signal of a pulse width proportional to the phase difference.

The control voltage generation circuit 44 generates a control voltage VC2 based on the result of the phase comparison obtained from the phase comparison circuit 42. For example, the control voltage generation circuit 44 generates the control voltage VC2 for controlling the oscillation of the voltage controlled oscillation circuit 46 by performing a charge pump operation or filter processing based on the signal CQ of the phase comparison result from the phase comparison circuit 42.

A voltage controlled oscillation circuit 46 that is a voltage controlled oscillator (VCO) generates a clock signal CKQ having a frequency corresponding to the control voltage VC2. For example, an oscillation operation is performed based on the control voltage VC2 from the control voltage generation circuit 44 to generate the clock signal CKQ. For example, the voltage controlled oscillation circuit 46 generates a clock signal CKQ having a frequency that changes according to the control voltage VC2 by the oscillation operation. As an example, the voltage controlled oscillation circuit 46 has a variable capacitance element such as a varactor. By changing the capacitance of the variable capacitance element based on the control voltage VC2, the frequency of the clock signal CKQ that is an oscillation signal generated by the oscillation operation of the voltage controlled oscillation circuit 46 is changed. As the voltage controlled oscillation circuit 46, for example, an LC oscillation circuit using an inductor can be used.

The dividing circuit 48 divides the clock signal CKQ and outputs a feedback clock signal FBCK. For example, the dividing circuit 48 outputs a signal having a frequency obtained by dividing the frequency of the clock signal CKQ by the division ratio set by division ratio setting signal SDIV as a feedback clock signal FBCK. For example, when the frequency of oscillation of the voltage controlled oscillation circuit 46 is set to fvco and the division ratio of dividing operation of the frequency dividing circuit 48 is set to DIV, the frequency of the feedback clock signal FBCK becomes fvco/DIV. Then, as described above, the phase comparison circuit 42 performs a phase comparison between the clock signal CK1 and the feedback clock signal FBCK from the frequency dividing circuit 48.

By using the PLL circuit 40 having a configuration including the phase comparison circuit 42, the control voltage generation circuit 44, the voltage controlled oscillation circuit 46, and the dividing circuit 48, the clock signal CKQ which is phase-synchronized with the clock signal CK1 is generated, and a highly accurate clock signal CK2 based on the clock signal CKQ can be generated and output.

In the present embodiment, the processing circuit 34 includes a delta sigma modulator 36 and a calculation circuit 38. By performing delta sigma modulation by the delta sigma modulator 36, the PLL circuit 40 operates as the fractional N type PLL circuit. The calculation circuit 38 performs the second temperature compensation processing based on the temperature detection data DT from the A/D conversion circuit 60 and the division ratio setting value VDIV from the register 62. The division ratio setting value VDIV is data for setting a division ratio of the PLL circuit 40. The delta sigma modulator 36 performs a delta sigma modulation on the calculation value that is a calculation result of the calculation circuit 38, and outputs a division ratio setting signal SDIV that sets the division ratio of the dividing circuit 48.

For example, in FIG. 13, the dividing circuit 48 and the delta sigma modulator 36 constitute a fractional divider. The fractional divider divides the clock signal CKQ using the reciprocal of the multiplication ratio of the PLL circuit 40 as a division ratio, and outputs the divided clock signal to the phase comparison circuit 42 as a feedback clock signal FBCK. The delta sigma modulator 36 performs delta sigma modulation on the value of the fraction part of the division ratio to generate a modulation value that is an integer. For example, the delta sigma modulator 36 performs third-order or fourth-order delta sigma modulation processing. The value of the integer part of the division ratio and the added value of the modulation value are set in the dividing circuit 48 as the division ratio setting signal SDIV. As a result, a fractional N type PLL circuit 40 is realized.

Specifically, the delta sigma modulator 36 performs the delta sigma modulation that integrates and quantizes the fractional division ratio L/M to generate a delta sigma modulated signal. The delta sigma modulator 36 performs a process of adding/subtracting the delta sigma modulated signal and an integer division ratio N, and an output signal after the addition/subtraction is input to the dividing circuit 48. In the output signal after the addition/subtraction, a plurality of integer division ratios in the range near the integer division ratio N change in time series, and the average value of time thereof matches N+L/M. The N+L/M is set by the division ratio setting signal SDIV from the processing circuit 34. For example, as described above, the frequency of the clock signal CKQ is set to fvco, and the phase comparison frequency that is the frequency of the clock signal CK1 and the feedback clock signal FBCK is set to fpfd. In this case, in a normal state in which the phase of the clock signal CK1 that is the reference clock signal and the phase of the feedback clock signal FBCK are synchronized, the relational expression of "fvco=(N+L/M)×fpfd" is established. By using the fractional N type PLL circuit 40 having such a configuration, a clock signal CKQ obtained by multiplying the clock signal CK1 by a division ratio represented by "N+L/M" can be generated.

The calculation circuit 38 performs the second temperature compensation processing based on the temperature detection data DT, and generates a temperature compensation value. The calculation circuit 38 performs the adding processing on the division ratio setting value VDIV and the temperature compensation value to obtain a calculated value, and outputs the obtained calculated value to the delta sigma modulator 36 as a calculation result. The delta sigma modulator 36 performs a delta sigma modulation with respect to the calculated value, generates a division ratio setting signal SDIV, and outputs the generated division ratio setting signal SDIV to the frequency dividing circuit 48.

As described above, it is possible to realize a fractional divider and realize the second temperature compensation processing in which fluctuations in the frequency of the clock signal CK2 due to the temperature change can be suppressed. In addition, according to the present embodiment, the fractional division processing for realizing the fractional divider and the temperature compensation processing are collectively executed by the digital calculation processing in the processing circuit 34. Therefore, the fractional division processing and the temperature compensation processing can be realized while suppressing an increase in the circuit scale of the circuit device 30.

Figure 14:
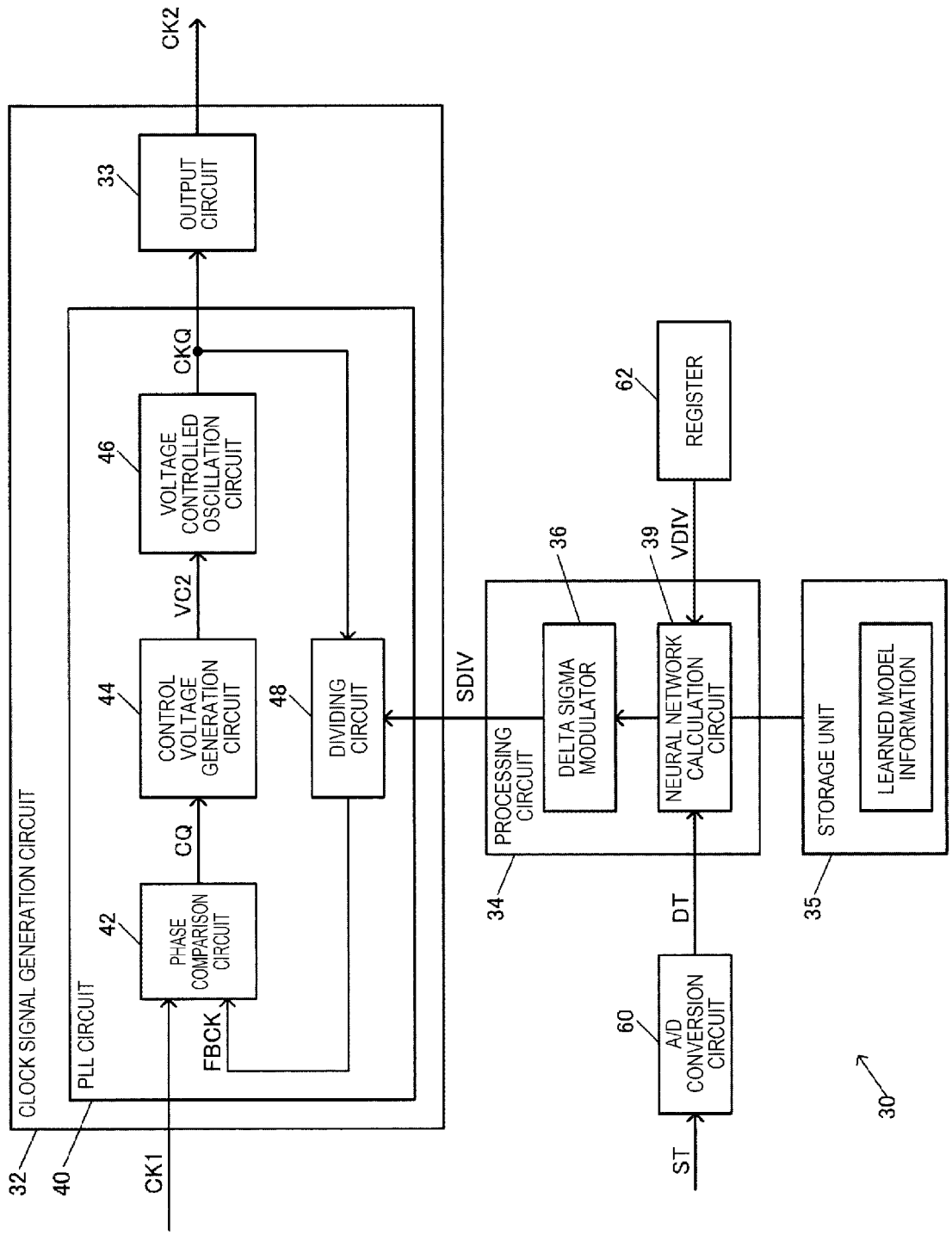
FIG. 14 shows a second configuration example of the second circuit device.

FIG. 14 shows a second configuration example of the circuit device 30. FIG. 14 differs from FIG. 13 in that the processing circuit 34 has a neural network calculation circuit 39 in FIG. 14, and the storage unit 35 stores the learned model information for the neural network calculation. That is, FIG. 14 corresponds to the configuration example described in FIG. 4. Further, the circuit device 30 includes the storage unit 35 that stores learned model information, and the processing circuit 34 performs the second temperature compensation processing based on the learned model information. Note that when the second temperature compensation processing is performed based on the learned model information, it is desirable to perform a neural network calculation based on the temperature detection signal from a plurality of temperature sensors. For example, the neural network calculation is performed based on the temperature detection signals from one or a plurality of temperature sensors 26 provided in the circuit device 20, or one or a plurality of external temperature sensors 27, or one or a plurality of temperature sensors provided in the circuit device 30, or the like.

A neural network is a mathematical model for simulating brain functions on a computer, and has an input layer, an intermediate layer, and an output layer. The input layer is a neuron that outputs an input value. In each neuron after the intermediate layer, a calculation is performed that simulates how information is transmitted as an electrical signal in a brain. In the brain, since the ease of transmission of information changes according to the synaptic bonding strength, the neural network expresses the bonding strength with a weight. Further, in the calculation in a neuron, an activation function that is a non-linear function is used. For example, a ReLU function, a sigmoid function, or the like is used as the activation function. In each neuron, a calculation is performed for multiplying and summing the outputs of each neuron in the previous layer connected to the neuron using the weight, a bias is added, and a calculation that applies the activation function is performed. The calculation result in the output layer becomes the output of the neural network.

In a neural network, in order to obtain a desired output from an input, it is necessary to set appropriate weights and biases. Hereinafter, the weight is also represented as a weighting coefficient. The weighting coefficient may include a bias. In learning, a data set in which an input is associated with a correct output at the input is prepared. The correct output is teacher data. Neural network learning processing can be considered as processing for obtaining the most probable weighting coefficient based on the data set. As the neural network learning processing, for example, an error inverse propagation method can be used. In the error inverse propagation method, parameters are updated by repeating the forward path and the backward path. The parameter here is a weighting coefficient.

In the present embodiment, the input of the neural network is temperature detection data. In this case, it is desirable to input a plurality of temperature detection data from a plurality of temperature sensors. The storage unit 35 stores, for example, information on the weighting coefficient of the neural network as the learned model information. In the learned model information, an input layer, an intermediate layer, and an output layer are included, and weighting coefficient information is set based on a data set in which temperature detection data and a temperature compensation value are associated with each other. The neural network calculation circuit 39 performs a calculation based on the weighting coefficient information stored in the storage unit 35 using the temperature detection data as an input of the input layer of the learned model information, and performs a neural network calculation so that the temperature compensation value is output as the output of the output layer of the learned model information. In this case, for example, in the learning stage at the time of manufacture and shipment, the clock frequency at each temperature is measured, and a temperature compensation value for making the clock frequency constant with respect to the temperature change is obtained based on the measured clock frequency. Based on a data set in which the temperature compensation value is associated with the temperature detection data corresponding to each temperature, the weighting coefficient information is set and written in the storage unit 35 as the learned model information. As described above, the second temperature compensation processing based on the learned model information can be realized. Note that the machine learning in the present embodiment is not limited to a technique using a neural network. Various well-known machine learning methods such as a support vector machine (SVM), or machine learning methods developed from these methods can be applied, for example.

By performing the second temperature compensation processing by the neural network calculation based on the learned model information as shown in FIG. 14, it is possible to realize a more accurate and appropriate second temperature compensation processing. For example, it is possible to realize the second temperature compensation processing in which adverse effects due to a change in manufacturing process or a change in circuit characteristics is suppressed.

Figure 15:
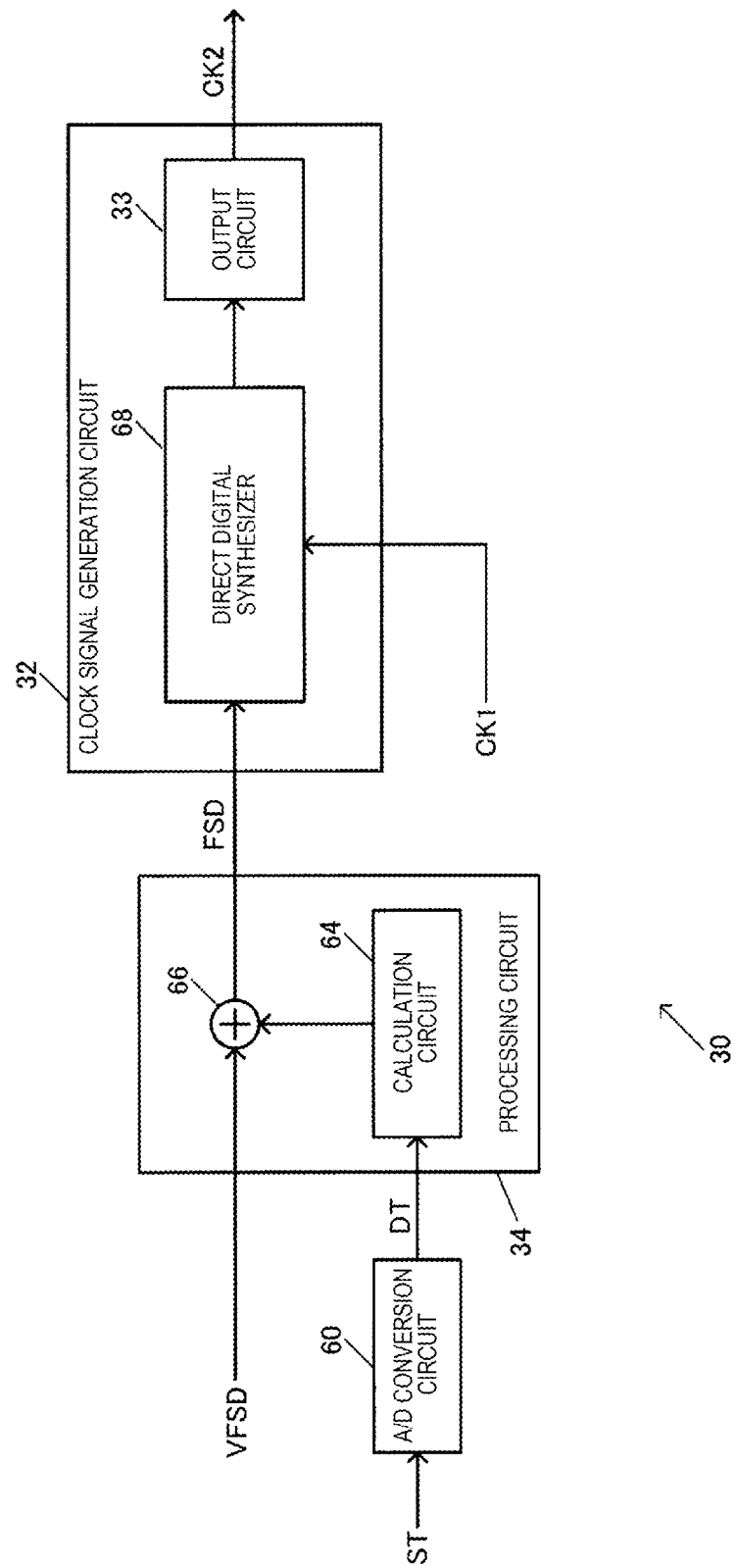
FIG. 15 shows a third configuration example of the second circuit device.

FIG. 15 shows a third configuration example of the circuit device 30. In FIG. 15, the clock signal generation circuit 32 includes a direct digital synthesizer 68. The direct digital synthesizer 68 generates the clock signal CK2 having a frequency set by the frequency setting signal FSD using the clock signal CK1 as a reference clock signal.

Specifically, in FIG. 15, the processing circuit 34 includes a calculation circuit 64 and an adder 66. The temperature detection data DT obtained by A/D converting the temperature detection signal ST by the A/D conversion circuit 60 is input to the calculation circuit 64. The calculation circuit 64 performs the calculation processing for obtaining a temperature compensation value based on the temperature detection data DT, and outputs the temperature compensation value to the adder 66. The calculation processing of the temperature compensation value in this case may be realized by the calculation processing such as a neural network calculation based on the learned model information described in FIGS. 4 and 14. The adder 66 performs processing of adding the temperature compensation value to the frequency setting value VFSD, and outputs the frequency setting signal FSD to the clock signal generation circuit 32. The direct digital synthesizer 68 of the clock signal generation circuit 32 generates the clock signal CK2 having a frequency set by the frequency setting signal FSD. The output circuit 33 outputs the generated clock signal CK2 to the outside in a signal format such as LVDS, PECL, HCSL, or differential CMOS.

The direct digital synthesizer 68 is a circuit that digitally generates a clock signal having any frequency based on a reference clock signal. The reference clock signal is the clock signal CK1. The direct digital synthesizer 68 includes, for example, a phase accumulator that is an integration block and a waveform signal generation circuit. The phase accumulator integrates integration setting values in synchronization with the reference clock signal as an operation for one cycle. The clock frequency is set by the integration setting value. The waveform signal generation circuit can include, for example, a waveform memory and a D/A conversion circuit. The integration result by the phase accumulator becomes an address of the waveform memory, thereby a clock waveform having a clock frequency corresponding to the frequency setting signal FSD is generated.

By using the direct digital synthesizer 68 as shown in FIG. 15, a clock signal CK2 having any frequency set by the frequency setting value VFSD can be generated. Further, the processing circuit 34 performs the second temperature compensation processing, so that the temperature compensated highly accurate clock signal CK2 can be generated.

4. Structural Example of Oscillator

Figure 16:
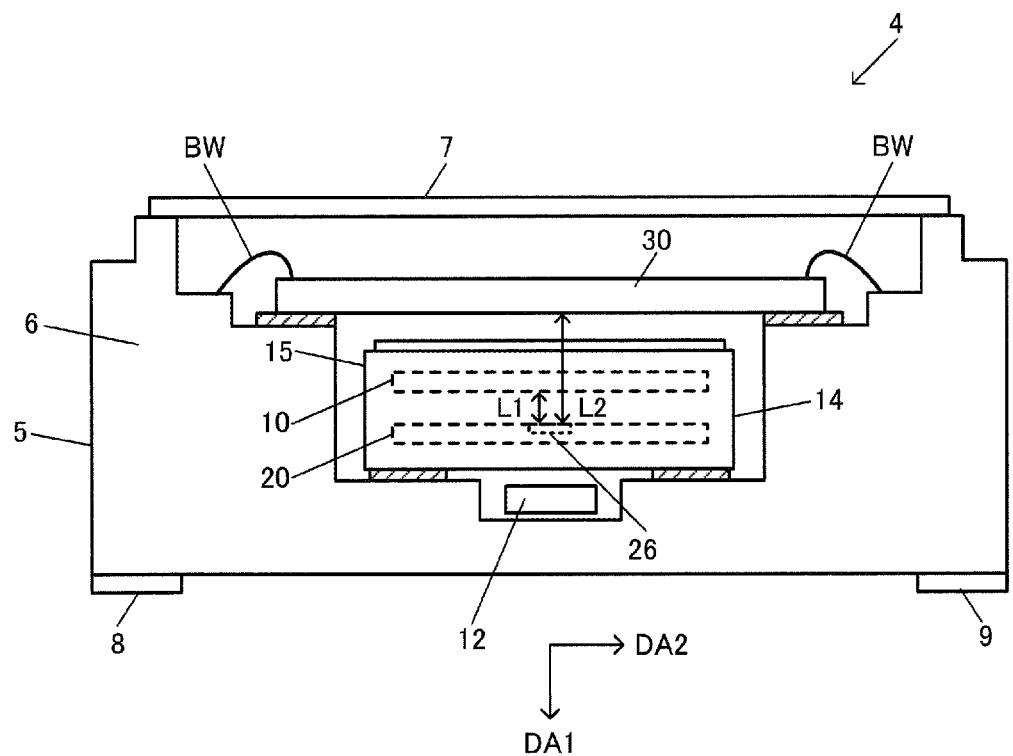
FIG. 16 shows a first structural example of the oscillator.

Next, a structural example of the oscillator 4 will be described. FIG. 16 shows a first structural example of the oscillator 4. FIG. 16 is a cross-sectional diagram schematically showing a structure of the oscillator 4. In the present embodiment, the oscillator 4 includes the resonator 10, the circuit device 20, and the circuit device 30. The oscillator 4 also includes the package 15 accommodating the resonator 10 and the circuit device 20, and a package 5 accommodating the package 15 and the circuit device 30. The package 15 and the package 5 are a first package and a second package, respectively. The first package and the second package can also be referred to as a first container and a second container.

In the present embodiment, the circuit device 20 accommodated in the package 15 performs the first temperature compensation processing, and the circuit device 30 accommodated in the package 5 performs the second temperature compensation processing. For example, the resonator 10 and the circuit device 20 are accommodated in the package 15, so that a temperature compensation type oscillator 14 that performs, for example, an analog-mode first temperature compensation processing is configured. Further, the oscillator 14 that performs analog-mode first temperature compensation processing and the circuit device 30 that performs digital-mode second temperature compensation processing are accommodated in the package 5, so that the oscillator 4 that generates highly accurate clock signal is configured. The circuit device 30 can also be called a correction IC that performs the second temperature compensation processing with a fine adjustment in a digital-mode.

Specifically, the package 5 is made of, for example, ceramic or the like, and has an accommodation space inside thereof. In this accommodation space, the oscillator 14, in which the resonator 10 and the circuit device 20 are accommodated in the package 15, and the circuit device 30 are accommodated. The accommodation space is hermetically sealed and may be in a reduced pressure state that is close to a vacuum state. With the package 5, the circuit device 30 and the oscillator 14 can be suitably protected from impact, dust, heat, moisture, and the like.

The package 5 has a base 6 and a lid 7. Specifically, the package 5 includes a base 6 that supports the oscillator 14 and the circuit device 30, and a lid 7 that is bonded to the upper surface of the base 6 so as to form an accommodation space with the base 6. The base 6 has a first recess portion opening on the upper surface and a second recess portion opening on the bottom surface of the first recess portion. The circuit device 30 is supported on the bottom surface of the first recess portion. For example, the circuit device 30 is supported by a step portion on the bottom surface via a terminal electrode. The oscillator 14 is supported on the bottom surface of the second recess portion. For example, the oscillator 14 is supported by the step portion on the bottom surface via the terminal electrode. Further, the base 6 has a third recess portion opening in the bottom surface of the second recess portion, and the circuit component 12 is disposed in the third recess portion. As the disposed circuit component 12, for example, a capacitor, the external temperature sensor 27 described in FIG. 3, or the like can be assumed.

The circuit device 30 is electrically coupled to a terminal of the oscillator 14 via, for example, a bonding wire BW, a terminal electrode formed in a step portion, or an internal wiring of the package 5. Thereby, the clock signal CK1 or the temperature detection signal ST from the oscillator 14 can be input to the circuit device 30. Further, the circuit device 30 is electrically coupled to an external terminals 8 and 9 of the oscillator 4 via the bonding wire BW, the terminal electrode formed in the step portion, and the internal wiring of the package 5. The external terminals 8 and 9 are formed on the outer bottom surface of the package 5. The external terminals 8 and 9 are coupled to an external device via the external wirings. The external wiring is, for example, wiring or the like formed on a circuit substrate on which an external device is mounted. Thereby, electrical coupling between the circuit device 30 and the external device becomes possible, and the clock signal CK2 and the like can be output with respect to the external device. Note that the terminal of the oscillator 14 and the external terminals 8 and 9 may be electrically coupled with each other.

In FIG. 16, the oscillator 14 is disposed below the circuit device 30. For example, a direction orthogonal to a substrate of the circuit device 30 and toward the bottom surface of the package 5 is set to DA1, and a direction orthogonal to the direction DA1 is set to a direction DA2. The substrate of the circuit device 30 is a semiconductor substrate. In this case, the oscillator 14 is disposed in the direction DA1 of the circuit device 30. The circuit component 12 is disposed in the direction DA1 of the oscillator 14. The circuit device 30 is disposed with the direction DA2 as the longitudinal direction of the substrate.

In FIG. 16, the circuit device 30 performs the first temperature compensation processing based on the temperature detection signal ST from the temperature sensor 26, and a distance L1 between the temperature sensor 26 and the resonator 10 is made shorter than a distance L2 between the temperature sensor 26 and the circuit device 30. For example, the temperature sensor 26 is formed in the circuit device 20 that is a semiconductor chip, and the resonator 10 is disposed such that the main surface thereof faces the main surface of the circuit device 20. The distance L1 is a distance between the temperature sensor 26 and the resonator 10 in the direction DA1, for example, the shortest distance between the temperature sensor 26 and the resonator 10 in the direction DA1. Further, the distance L2 is a distance between the temperature sensor 26 and the circuit device 30 in the direction DA1, for example, the shortest distance between the temperature sensor 26 and the circuit device 30 in the direction DA1.

Thus, by making the distance L1 shorter than the distance L2, the temperature of the resonator 10 can be measured more accurately by the temperature sensor 26. For example, the circuit device 30 performs the digital-mode second temperature compensation processing or generates a high-speed clock signal by the PLL circuit 40 or the direct digital synthesizer 68, and thus becomes a heat generation source that generates high heat. Therefore, when the distance L2 between the circuit device 30 and the temperature sensor 26 is short, the heat from the circuit device 30 that is a heat generation source adversely affects the temperature measurement of the resonator 10 by the temperature sensor 26.

In this regard, in the present embodiment, since the distance L1 is short and the distance L2 is long, the adverse effects of the heat generated by the circuit device 30 on the temperature measurement can be reduced. Further, in the present embodiment, the resonator 10 and the circuit device 20 are accommodated in the package 15, so that the heat transfer from the circuit device 30 can be blocked by the package 15. Therefore, the adverse effects of the heat generated by the circuit device 30 on the temperature measurement can be further reduced. Thereby, the hysteresis error can be greatly reduced as shown in FIG. 10.

Figure 17:
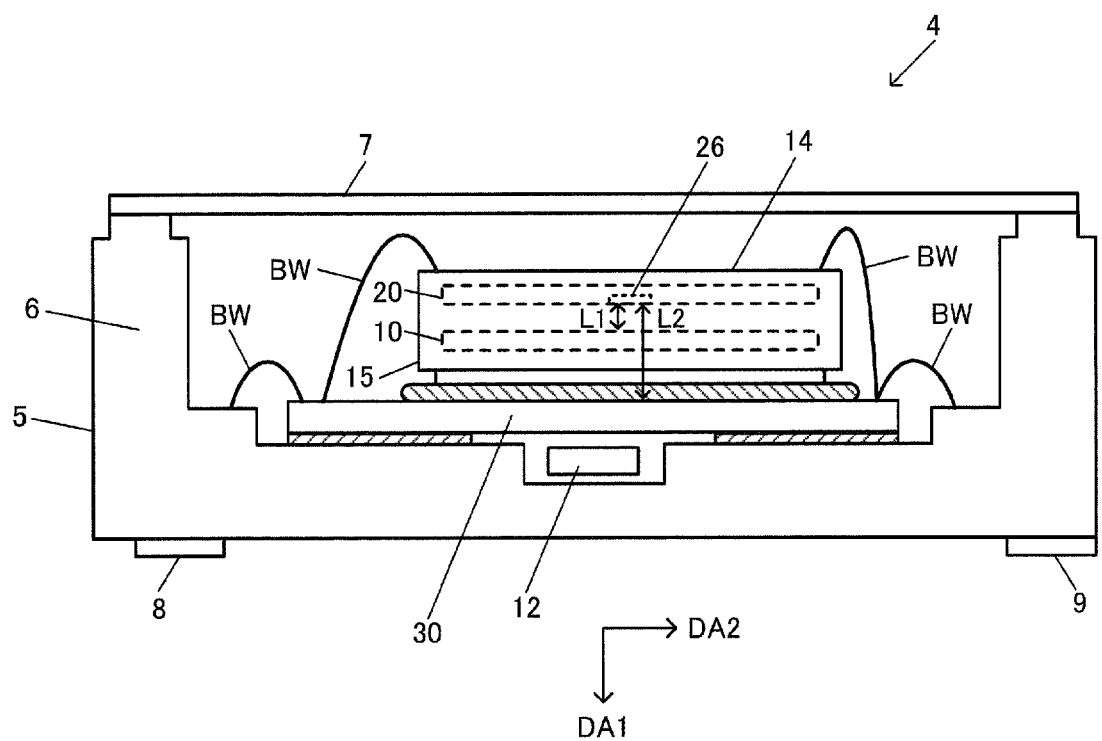
FIG. 17 shows a second structural example of the oscillator.

FIG. 17 shows a second structural example of the oscillator 4. In FIG. 17, the circuit device 30 for correction is disposed on the bottom surface of the package 5, and the oscillator 14 is disposed above the circuit device 30. For example, in FIG. 16, the oscillator 14 is disposed below the circuit device 30 in the direction DA1, but in FIG. 17, the oscillator 14 is disposed in the direction opposite to the direction DA1. In FIG. 17, the oscillator 14 is disposed so that the vertical direction is opposite to that in FIG. 16, and the terminal on the bottom surface of the oscillator 14 is electrically coupled to the terminal that is a pad of the circuit device 30 via the bonding wire BW. The terminals of the circuit device 30 are electrically coupled to the external terminals 8 and 9 via the bonding wires BW, terminal electrodes, or internal wiring of the package 5. Also in the second structural example of FIG. 17, the distance L1 between the temperature sensor 26 and the resonator 10 is shorter than the distance L2 between the temperature sensor 26 and the circuit device 30. Thereby, accurate temperature measurement of the resonator 10 by the temperature sensor 26 becomes possible.

Figure 18:
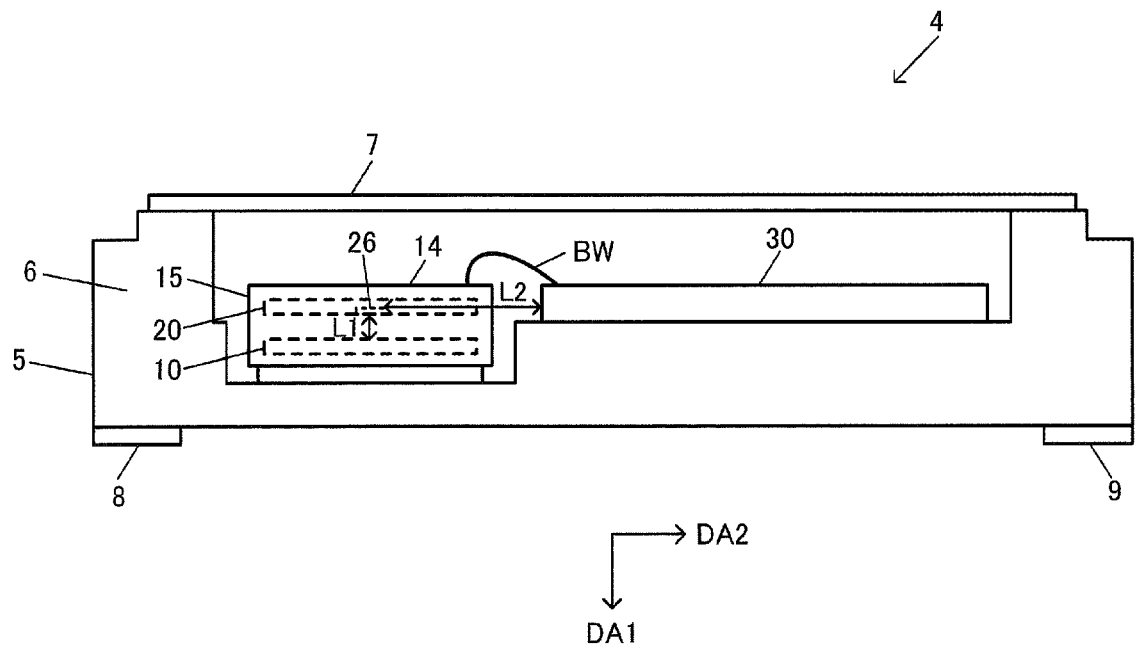
FIG. 18 shows a third structural example of the oscillator.

FIG. 18 shows a third structural example of the oscillator 4. In FIG. 18, the circuit device 30 is disposed in the direction DA 2 of the oscillator 14. For example, the oscillator 14 and the circuit device 30 are arranged in the direction DA2 when the oscillator 4 is viewed from above. Also in the third structural example in FIG. 18, the distance L1 between the temperature sensor 26 and the resonator 10 is shorter than the distance L2 between the temperature sensor 26 and the circuit device 30, thereby it is possible to measure the temperature of the resonator 10 accurately by the temperature sensor 26. From the viewpoint of making the oscillator 4 compact, the first and second structural examples in FIGS. 16 and 17 are more desirable than the third structural example in FIG. 18.

Figure 19:
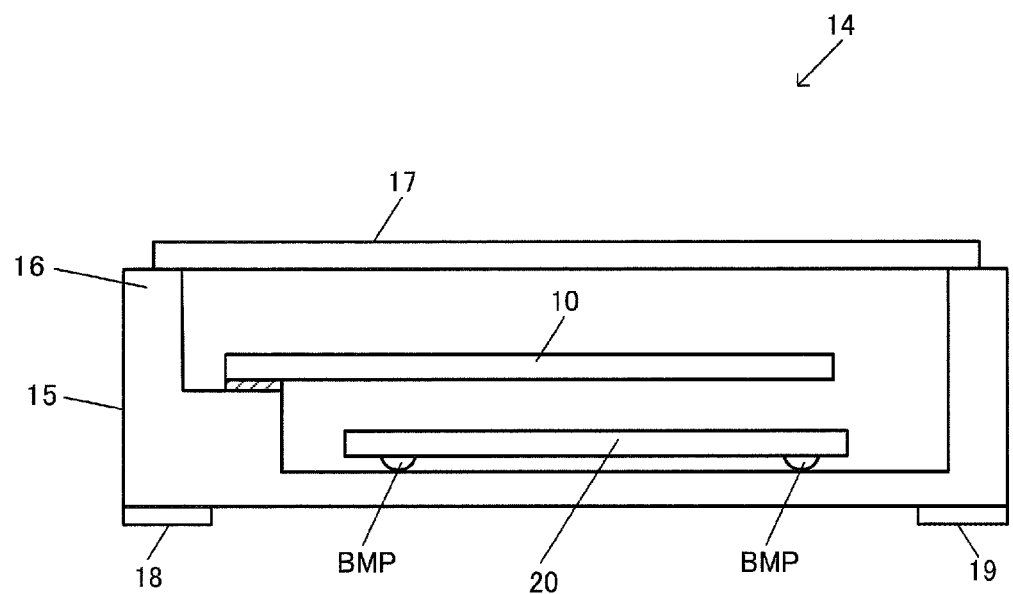
FIG. 19 is a structural example of the oscillator in which a resonator and a circuit device are accommodated.

FIG. 19 shows a structural example of the oscillator 14. The oscillator 14 has the resonator 10, the circuit device 20, and the package 15 that accommodates the resonator 10 and the circuit device 20. The package 15 is made of, for example, ceramic or the like, and has an accommodation space inside thereof, and the resonator 10 and the circuit device 20 are accommodated in the accommodation space. The accommodation space is hermetically sealed and may be in a reduced pressure state that is close to a vacuum state. With the package 15, the resonator 10 and the circuit device 20 can be suitably protected from impact, dust, heat, moisture, and the like.

The package 15 has a base 16 and a lid 17. Specifically, the package 15 includes a base 16 that supports the resonator 10 and the circuit device 20, and a lid 17 that is bonded to the upper surface of the base 16 so as to form an accommodation space with the base 16. And the resonator 10 is supported by the step portion provided inside the base 16 via the terminal electrode. The circuit device 20 is disposed on the inner bottom surface of the base 16. Specifically, the circuit device 20 is disposed such that the active surface faces the inner bottom surface of the base 16. The active surface is a surface on which circuit elements of the circuit device 20 are formed. Further, bumps BMP are formed on terminals that are pads of the circuit device 20. The circuit device 20 is supported on the inner bottom surface of the base 16 via the conductive bumps BMP. The conductive bump BMP is, for example, a metal bump, and the resonator 10 and the circuit device 20 are electrically coupled to each other via the bump BMP, the internal wiring of the package 15, the terminal electrode, or the like. The circuit device 20 is electrically coupled to the external terminals 18 and 19 of the oscillator 14 via the bumps BMP or the internal wiring of the package 15. The external terminals 18 and 19 are formed on the outer bottom surface of the package 15. As shown in FIGS. 16, 17, and 18, the external terminals 18 and 19 of the oscillator 14 are electrically coupled to the circuit device via bonding wires BW, internal wiring, or terminal electrodes. Thereby, the clock signal CK1 or the temperature detection signal ST from the oscillator 14 can be input to the circuit device 30.

In FIG. 19, the circuit device 20 is flip-mounted so that the active surface of the circuit device 20 faces downward, but the present embodiment is not limited to such mounting. For example, the circuit device 20 may be mounted so that the active surface of the circuit device 20 faces upward. That is, the circuit device 20 is mounted so that the active surface faces the resonator 10. According to this mounting, as shown in FIGS. 16, 17, and 18, the temperature sensor 26 formed on the active surface of the circuit device 20 faces the resonator 10. Further, in the present embodiment, the double seal structure in which the resonator 10 and the circuit device 20 are accommodated in the package 15 of the oscillator 14, and the oscillator 14 and the circuit device 30 are accommodated in the package 5 has been described. However, the structure of the oscillator 4 of the present embodiment is not limited to this, and various modifications can be made. For example, a single seal structure in which the resonator 10, the circuit device 20, and the circuit device 30 are accommodated in one package 5 may be adopted.

5. Electronic Apparatus and Vehicle

Figure 20:
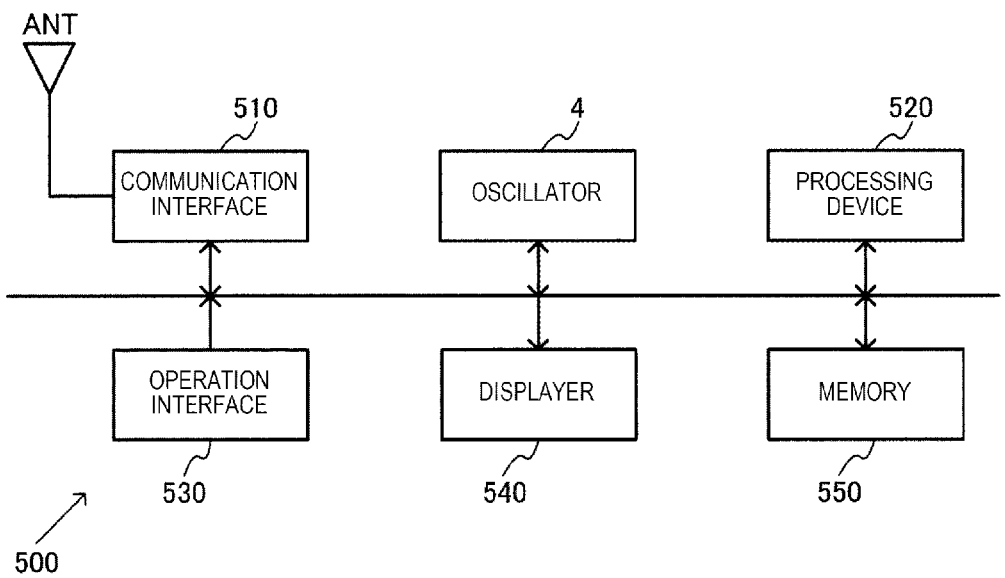
FIG. 20 shows a configuration example of an electronic apparatus.

FIG. 20 shows a configuration example of an electronic apparatus 500 including the oscillator 4 of the present embodiment. The electronic apparatus 500 includes an oscillator 4 and a processing device 520 that operates based on a clock signal CK2 from the oscillator 4. The electronic apparatus 500 can include an antenna ANT, a communication interface 510, an operation interface 530, a displayer 540, and a memory 550. The electronic apparatus 500 is not limited to the configuration shown in FIG. 20, and various modifications such as omitting some of these components or adding other components are possible.

The electronic apparatus 500 is, for example, a network-related apparatus such as a base station or a router, a high-precision measuring apparatus that measures physical quantities such as distance, time, flow velocity, or flow rate, a biological information measuring apparatus that measures biological information, or an in-vehicle apparatus. The biological information measuring apparatus is, for example, an ultrasonic measuring apparatus, a pulse wave meter, a blood pressure measuring apparatus, or the like. The in-vehicle apparatus is an apparatus for automatic driving or the like. The electronic apparatus 500 may be a wearable apparatus such as a head mounted type display device or a clock related apparatus, a mobile information terminal such as a robot, a printing device, a projection device, a smartphone, a content providing apparatus that delivers content, a video apparatus such as a digital camera or a video camera, or the like.

Further, as the electronic apparatus 500, there is an apparatus used in a next generation mobile communication system such as 5G. For example, the oscillator 4 of the present embodiment can be used in various apparatuses such as a base station, a remote radio head (RRH), or a mobile communication terminal of a next generation mobile communication system. In the next generation mobile communication system, a highly accurate clock frequency is required for time synchronization and the like, which is suitable as an application example of the oscillator 4 of the present embodiment that can realize a frequency deviation of, for example, 10 ppb or less.

The communication interface 510 performs processing of receiving data from the outside via the antenna ANT and transmitting data to the outside. The processing device 520 that is a processor performs control processing of the electronic apparatus 500, various digital processing of data transmitted/received via the communication interface 510, or the like. The function of the processing device 520 can be realized, for example, by a processor such as a microcomputer. The operation interface 530 is for a user to perform an input operation, and can be realized by an operation button, a touch panel display, or the like. The displayer 540 displays various types of information and can be realized by a display such as a liquid crystal or an organic EL. The memory 550 stores data, and the function can be realized by a semiconductor memory such as a RAM or a ROM.

Figure 21:
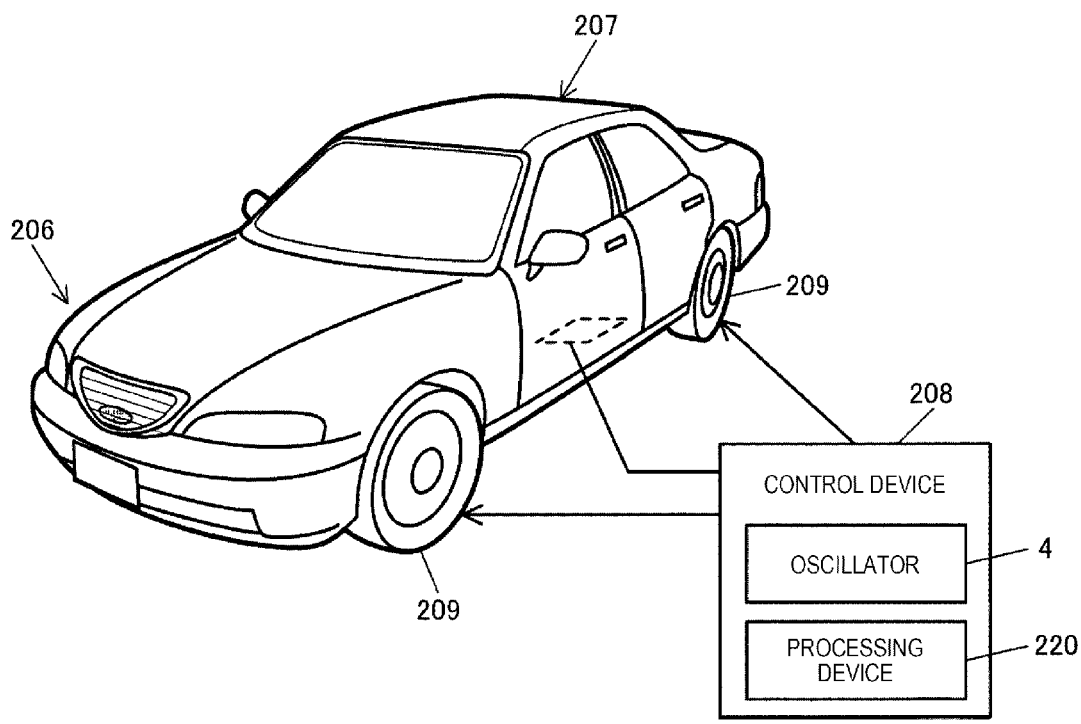
FIG. 21 shows a configuration example of a vehicle.

FIG. 21 shows an example of a vehicle including the oscillator 4 of the present embodiment. The vehicle includes an oscillator 4 and a processing device 220 that operates based on a clock signal CK2 from the oscillator 4. The oscillator 4 of the present embodiment can be incorporated into various vehicles such as automobiles, airplanes, motorcycles, bicycles, or ships. The vehicle is an apparatus/device that moves on the ground, in the sky, or on the sea, and includes a driving mechanism such as an engine or a motor, a steering mechanism such as a steering wheel or a rudder, and various electronic apparatuses. FIG. 21 schematically shows an automobile 206 as a specific example of the vehicle. In the automobile 206, the oscillator 4 of the present embodiment is incorporated. The control device 208 includes the oscillator 4 and the processing device 220 that operates based on the clock signal CK2 generated by the oscillator 4. The control device 208, for example, controls the hardness of the suspension according to the posture of an automobile body 207, and controls brakes of the individual wheels 209. For example, automatic driving of the automobile 206 may be realized by the control device 208. The apparatus in which the oscillator 4 of the present embodiment is incorporated is not limited to such a control device 208, and can be incorporated in various in-vehicle apparatuses such as a meter panel apparatus and a navigation apparatus provided in a vehicle such as the automobile 206.

As described above, the oscillator according to the present embodiment includes the resonator, and the first circuit device and the second circuit device which are electrically coupled to the resonator. The first circuit device generates a first clock signal by causing the resonator to oscillate, and performs the first temperature compensation processing for temperature compensating a frequency of the first clock signal. The second circuit device receives the first clock signal from the first circuit device, generates a second clock signal based on the first clock signal, and performs second temperature compensation processing for temperature compensating a frequency of the second clock signal.

According to the present embodiment, the first circuit device that oscillates the resonator performs the first temperature compensation processing, thereby the amount of the frequency fluctuation in the frequency-temperature characteristics of the first clock signal which is output from the first circuit device, can be reduced. The second circuit device performs the second temperature compensation processing when the second clock signal is generated based on the first clock signal from the first circuit device. As described above, the second temperature compensation processing is performed by the second circuit device after the first temperature compensation processing is performed by the first circuit device, thereby it becomes possible to reduce or the like the micro-jump of frequency caused by variation of the temperature measurement result or the like, and possible to realize the clock frequency of the oscillator with high accuracy or the like.

The first circuit device may have a temperature sensor and perform the first temperature compensation processing based on a temperature detection signal from the temperature sensor.

By performing the first temperature compensation processing using the temperature sensor built in the first circuit device in this way, appropriate temperature compensation of the frequency-temperature characteristics of the resonator can be performed.

In the present embodiment, a distance between the temperature sensor and the resonator may be shorter than a distance between the temperature sensor and the second circuit device.

As described above, the temperature of the resonator can be measured more accurately using the temperature sensor by making the distance between the temperature sensor and the resonator shorter than the distance between the temperature sensor and the second circuit device.

In the present embodiment, the second circuit device may receive the temperature detection signal from the temperature sensor and perform the second temperature compensation processing based on the temperature detection signal.

As described above, the first temperature compensation processing in the first circuit device and the second temperature compensation processing in the second circuit device can be performed based on the temperature detection signal from the same temperature sensor so that more appropriate temperature compensation processing can be realized.

In the present embodiment, the second circuit device may receive the temperature detection signal from the external temperature sensor provided outside the first circuit device and the second circuit device, and perform the second temperature compensation processing based on the temperature detection signal.

As described above, an appropriate temperature measurement becomes possible by disposing the external temperature sensor at a place suitable for temperature measurement.

In the present embodiment, an absolute value of the frequency deviation of the second clock signal due to the temperature fluctuation may be smaller than an absolute value of the frequency deviation of the first clock signal due to the temperature fluctuation.

As described above, the second temperature compensation processing with a fine adjustment is performed after the first temperature compensation processing with a coarse adjustment, so that a highly accurate second clock signal with a small absolute value of the frequency deviation can be output from the oscillator.

In the present embodiment, an absolute value of a frequency deviation of the first clock signal due to a temperature fluctuation may be one ppm or less in a temperature range of −40° C. or more and 105° C. or less.

As described above, the first clock signal, on which the first temperature compensation processing with a coarse adjustment where the absolute value of the frequency deviation is, for example, one ppm or less is performed, is input to the second circuit device, and the second temperature compensation processing is performed in the second circuit device, and a highly accurate second clock signal can be generated.

In the present embodiment, the first circuit device may include an oscillation circuit that generates the first clock signal by causing the resonator to oscillate, and a first processing circuit that performs the first temperature compensation processing. The second circuit device may include a clock signal generation circuit that generates a second clock signal having a frequency set by the frequency setting signal based on the first clock signal from the first circuit device, and a second processing circuit that outputs the frequency setting signal.

With this configuration, it is possible to cause the first circuit device to perform the processing of generating the first clock signal by causing the resonator to oscillate and the first temperature compensation processing for temperature compensating the frequency of the first clock signal. Further, it is possible to cause the second circuit device to perform the processing for generating the second clock signal based on the first clock signal and the second temperature compensation processing for temperature compensating the frequency of the second clock signal.

In the present embodiment, as the first temperature compensation processing, the first processing circuit generates a temperature compensated control voltage for compensating the frequency-temperature characteristics of the resonator and outputs the control voltage to the oscillation circuit. The second processing circuit may output a frequency setting signal that is a digital signal, to the clock signal generation circuit as the second temperature compensation processing.

As described above, by controlling the oscillation frequency of the oscillation circuit based on the control voltage generated by the first temperature compensation processing, the first clock signal, on which the first temperature compensation processing for compensating the frequency-temperature characteristics of the resonator is performed, can be generated. The first clock signal and the frequency setting signal generated by the second temperature compensation processing are input to the clock signal generation circuit so that the second clock signal, on which the second temperature compensation processing is performed, can be generated.

In the present embodiment, the second circuit device may include a storage unit that stores learned model information, and the second processing circuit may perform the second temperature compensation processing based on the learned model information.

As described above, by performing the second temperature compensation processing using the learned model information, it is possible to realize a more accurate and appropriate second temperature compensation processing.

In the present embodiment, the clock signal generation circuit may include a fractional N type PLL circuit to which the first clock signal is input as a reference clock signal, and the frequency setting signal may be division ratio data of the dividing circuit included in the PLL circuit.

As described above, the division ratio setting signal, on which the second temperature compensation processing is performed, is set in the dividing circuit of the PLL circuit, so that the second clock signal can be generated based on the signal obtained by multiplying the frequency of the first clock signal. Further, the second clock signal, on which the second temperature compensation processing is performed, can be generated based on the first clock signal.

Further, in the present embodiment, the PLL circuit may include a phase comparison circuit that performs a phase comparison between the first clock signal that is the reference clock signal and the feedback clock signal from the dividing circuit, the control voltage generation circuit that generates a control voltage based on the result of the phase comparison, and the voltage controlled oscillation circuit that generates a clock signal with a frequency corresponding to the control voltage.

By using the PLL circuit having such a configuration, a PLL clock signal which is phase-synchronized with the first clock signal can be generated, and a highly accurate second clock signal based on the PLL clock signal can be generated.

In the present embodiment, the clock signal generation circuit may include a direct digital synthesizer generating the second clock signal having a frequency set by the frequency setting signal using the first clock signal as a reference clock signal.

By using such a direct digital synthesizer, the second clock signal having any frequency set by the frequency setting signal can be generated. Further, the processing circuit performs the second temperature compensation processing, so that the temperature compensated highly accurate second clock signal can be generated.

In the present embodiment, a first package that accommodates the resonator and the first circuit device, and a second package that accommodates the first package and the second circuit device may be included.

As described above, the resonator and the first circuit device are accommodated in the first package, so that, for example, the heat transfer from the heat source outside the first package such as the second circuit device can be blocked by the first package, and the adverse effects of heat from the heat source outside the first package on the temperature measurement can be reduced.

The present embodiment relates to an electronic apparatus including the oscillator described above and a processing device that operates based on a second clock signal from the oscillator.

Further, the present embodiment relates to a vehicle including the oscillator described above and the processing device that operates based on the second clock signal from the oscillator.

Although the present embodiment has been described in detail as described above, it will be easily understood by those skilled in the art that many modifications can be made without departing from the novel matters and effects of the present disclosure. Accordingly, all such modifications are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. Further, the configuration and operation of the oscillator, the resonator, the first circuit device, the second circuit device, the oscillation circuit, the first processing circuit, the clock signal generation circuit, the second processing circuit, the electronic apparatus, the vehicle, and the like are described in the present embodiment. However, the present disclosure is not limited to this, and various modifications can be made.

What is claimed is:

1. An oscillator comprising:
   a resonator;
   a first circuit device electrically coupled to the resonator;
   a second circuit device;
   a first package including a first base and a first lid; and
   a second package including a second base and a second lid, wherein
   the first circuit device generates a first clock signal by causing the resonator to oscillate, and performs first temperature compensation processing for temperature compensating a frequency of the first clock signal,
   the first circuit device has a temperature sensor, and performs the first temperature compensation processing based on a temperature detection signal from the temperature sensor,
   the second circuit device receives the first clock signal from the first circuit device, generates a second clock signal based on the first clock signal, and performs second temperature compensation processing for temperature compensating a frequency of the second clock signal,
   the first package accommodates the resonator and the temperature sensor, and
   the second package accommodates the first package and the second circuit device.

2. The oscillator according to claim 1, wherein
   a distance between the temperature sensor and the resonator is shorter than a distance between the temperature sensor and the second circuit device.

3. The oscillator according to claim 1, wherein
the second circuit device receives the temperature detection signal from the temperature sensor and performs the second temperature compensation processing based on the temperature detection signal.

4. The oscillator according to claim 1, wherein
the second circuit device receives a temperature detection signal from an external temperature sensor provided outside the first circuit device and the second circuit device, and performs the second temperature compensation processing based on the temperature detection signal.

5. The oscillator according to claim 1, wherein
an absolute value of a frequency deviation of the second clock signal due to a temperature fluctuation is smaller than an absolute value of a frequency deviation of the first clock signal due to the temperature fluctuation.

6. The oscillator according to claim 1, wherein
an absolute value of a frequency deviation of the first clock signal due to a temperature fluctuation is one ppm or less in a temperature range of −40° C. or more and 105° C. or less.

7. The oscillator according to claim 1, wherein the first circuit device includes
an oscillation circuit generating the first clock signal by causing the resonator to oscillate, and
a first processing circuit performing the first temperature compensation processing, and
the second circuit device includes
a clock signal generation circuit generating the second clock signal having a frequency set by a frequency setting signal based on the first clock signal from the first circuit device, and
a second processing circuit outputting the frequency setting signal.

8. The oscillator according to claim 7, wherein
the first processing circuit generates a control voltage for a temperature compensation for compensating frequency-temperature characteristics of the resonator and outputs the control voltage to the oscillation circuit as the first temperature compensation processing, and
the second processing circuit outputs the frequency setting signal that is a digital signal, to the clock signal generation circuit as the second temperature compensation processing.

9. The oscillator according to claim 7, wherein the second circuit device includes a storage unit storing
learned model information, and
the second processing circuit performs the second temperature compensation processing based on the learned model information.

10. The oscillator according to claim 7, wherein the clock signal generation circuit includes a
fractional N type PLL circuit to which the first clock signal is input as a reference clock signal, and
the frequency setting signal is division ratio data of a dividing circuit included in the PLL circuit.

11. The oscillator according to claim 10, wherein the PLL circuit includes
a phase comparison circuit performing a phase comparison between the first clock signal that is the reference clock signal and a feedback clock signal from the dividing circuit,
a control voltage generation circuit generating a control voltage based on a result of the phase comparison, and
a voltage controlled oscillation circuit
generating a clock signal having a frequency corresponding to the control voltage.

12. The oscillator according to claim 7, wherein the clock signal generation circuit includes a direct
digital synthesizer generating the second clock signal having a frequency set by the frequency setting signal using the first clock signal as the reference clock signal.

13. An electronic apparatus comprising:
the oscillator according to claim 1; and
a processing device operating based on the second clock signal from the oscillator.

14. A vehicle comprising:
the oscillator according to claim 1; and
a processing device operating based on the second clock signal from the oscillator.

* * * * *